US012787615B2

(12) United States Patent
Joo et al.

(10) Patent No.: US 12,787,615 B2
(45) Date of Patent: Nov. 3, 2026

(54) DISPLAY APPARATUS AND METHOD OF MANUFACTURING THE SAME

(71) Applicant: SAMSUNG DISPLAY CO., LTD., Yongin-si (KR)

(72) Inventors: Sunkyu Joo, Yongin-si (KR); Sunyoung Kwon, Yongin-si (KR); Sangji Park, Yongin-si (KR); Jaecheol Park, Yongin-si (KR); Keunchan Oh, Yongin-si (KR); Dokyung Youn, Yongin-si (KR); Songee Lee, Yongin-si (KR); Wooman Ji, Yongin-si (KR); Youyoung Jin, Yongin-si (KR); Taehyung Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 553 days.

(21) Appl. No.: 18/229,529

(22) Filed: Aug. 2, 2023

(65) Prior Publication Data

US 2024/0215414 A1 Jun. 27, 2024

(30) Foreign Application Priority Data

Dec. 23, 2022 (KR) ........................ 10-2022-0183074

(51) Int. Cl.
*H10K 59/80* (2023.01)
*H10K 59/12* (2023.01)
(Continued)

(52) U.S. Cl.
CPC ..... *H10K 59/8792* (2023.02); *H10K 59/1201* (2023.02); *H10K 59/122* (2023.02); *H10K 59/38* (2023.02)

(58) Field of Classification Search
CPC .. H10K 59/38; H10K 59/122; H10K 59/1201; H10K 59/8792
See application file for complete search history.

(56) References Cited

U.S. PATENT DOCUMENTS 9,897,912 B2 * 2/2018 Tang ................. G02F 1/133617
10,026,788 B2 7/2018 Lim et al.
(Continued)

FOREIGN PATENT DOCUMENTS

KR 20110018785 A 2/2011
KR 20140062401 A 5/2014
(Continued)

*Primary Examiner* — Abdulmajeed Aziz
*Assistant Examiner* — Nathaniel J Lee
(74) *Attorney, Agent, or Firm* — CANTOR COLBURN LLP

(57) ABSTRACT

A display apparatus includes a first substrate, first to third light-emitting elements disposed over the first substrate and each including a first-color emission layer and a second-color emission layer, a second substrate disposed over the first substrate, a bank disposed on a lower surface of the second substrate facing the first substrate, where first to third bank openings is defined through the bank to overlap the first to third light-emitting elements, a first to third color filter layers disposed between the bank and the second substrate and overlapping the first to third light-emitting elements, a quantum-dot layer disposed in the third bank opening to overlap the third light-emitting element, and a spacer disposed on a lower surface of the bank facing the first substrate and including a same material as a material of the quantum-dot layer.

28 Claims, 12 Drawing Sheets

(51) Int. Cl.
*H10K 59/122* (2023.01)
*H10K 59/38* (2023.01)

(56) References Cited

U.S. PATENT DOCUMENTS

| | | | | |
|---|---|---|---|---|
| 10,808,174 | B2 | 10/2020 | Park et al. | |
| 10,971,557 | B2 | 4/2021 | Jeong et al. | |
| 2011/0042697 | A1* | 2/2011 | Lee | H10K 59/38 257/89 |
| 2014/0131674 | A1* | 5/2014 | Park | H10K 50/13 438/35 |
| 2019/0162993 | A1* | 5/2019 | Hong | G02F 1/133707 |
| 2020/0152705 | A1 | 5/2020 | Son et al. | |
| 2020/0266243 | A1* | 8/2020 | Kim | H10K 59/38 |
| 2020/0303465 | A1* | 9/2020 | Joo | H10K 59/121 |
| 2020/0373513 | A1 | 11/2020 | Kim et al. | |
| 2021/0328168 | A1* | 10/2021 | Park | G02B 5/201 |
| 2021/0328172 | A1* | 10/2021 | Joo | H10K 50/8428 |
| 2021/0399057 | A1 | 12/2021 | Ahn et al. | |
| 2022/0091445 | A1 | 3/2022 | Yoon et al. | |

FOREIGN PATENT DOCUMENTS

| | | | |
|---|---|---|---|
| KR | 1020160031652 | | 3/2016 |
| KR | 1020180077086 | A | 7/2018 |
| KR | 20190062654 | A | 6/2019 |
| KR | 1020200025980 | | 3/2020 |
| KR | 20200055846 | A | 5/2020 |
| KR | 20200111325 | A | 9/2020 |
| KR | 20200135672 | A | 12/2020 |
| KR | 20210129309 | A | 10/2021 |
| KR | 1020210158461 | | 12/2021 |
| KR | 1020220039963 | | 3/2022 |

* cited by examiner

DISPLAY APPARATUS AND METHOD OF MANUFACTURING THE SAME

This application claims priority to Korean Patent Application No. 10-2022-0183074, filed on Dec. 23, 2022, and all the benefits accruing therefrom under 35 U.S.C. § 119, the content of which in its entirety is herein incorporated by reference.

BACKGROUND

1. Field

One or more embodiments relate to a display apparatus and a method of manufacturing the display apparatus, and more particularly, to a display apparatus manufactured by a simple process and capable of displaying high-resolution images, and a method of manufacturing the display apparatus.

2. Description of the Related Art

A display apparatus typically includes a plurality of pixels. For a full-color display apparatus, a plurality of pixels may be configured to emit light of different colors. For this purpose, at least some of pixels in a display apparatus have a color-converting part. That is, at least a portion of light generated from a light-emitting part of some pixels is converted to light of a different color while passing through a corresponding color-converting part, and emitted to the outside.

SUMMARY

In a conventional display apparatus, it may not be easy to implement a high-resolution display.

One or more embodiments include a display apparatus manufactured by a simple process and capable of displaying high-resolution images, and a method of manufacturing the display apparatus.

According to one or more embodiments, a display apparatus includes a first substrate, first to third light-emitting elements disposed over the first substrate and each including a first-color emission layer and a second-color emission layer, a second substrate disposed over the first substrate with the first to third light-emitting elements therebetween, a bank disposed on a lower surface of the second substrate facing the first substrate, where first to third bank openings are defined through the bank to respectively overlap the first to third light-emitting elements when viewed in a direction perpendicular to the first substrate, a first color filter layer disposed between the bank and the second substrate and overlapping the first light-emitting element when viewed in the direction perpendicular to the first substrate, a second color filter layer disposed between the bank and the second substrate and overlapping the second light-emitting element when viewed in the direction perpendicular to the first substrate, a third color filter layer disposed between the bank and the second substrate and overlapping the third light-emitting element when viewed in the direction perpendicular to the first substrate, a quantum-dot layer disposed in the third bank opening to overlap the third light-emitting element when viewed in the direction perpendicular to the first substrate, and a spacer disposed on a lower surface of the bank facing the first substrate and including a same material as a material of the quantum-dot layer.

In an embodiment, the quantum-dot layer may include a concave portion and a protrusion, the concave portion may be disposed in the third bank opening of the bank, and the protrusion may be disposed on the lower surface of the bank facing the first substrate.

In an embodiment, the protrusion and the concave portion may be integrally formed as a single unitary and indivisible body.

In an embodiment, a distance between the lower surface of the second substrate facing the first substrate and a lower surface of the spacer facing the first substrate may be greater than a distance between the lower surface of the second substrate facing the first substrate and a lower surface of the protrusion facing the first substrate.

In an embodiment, the spacer and the protrusion may be integrally formed as a single unitary and indivisible body.

In an embodiment, the spacer may be apart from the quantum-dot layer when viewed in the direction perpendicular to the first substrate.

In an embodiment, the display apparatus may further include a first inorganic layer disposed between the first to third color filter layers and the bank, and a second inorganic layer covering a portion of the lower surface of the bank facing the first substrate and a lower surface of the quantum-dot layer in the direction to the first substrate, where the portion of the lower surface of the bank may be outside the quantum-dot layer and the spacer.

In an embodiment, the second inorganic layer may contact the first inorganic layer in the first bank opening and in the second bank opening.

According to one or more embodiments, a display apparatus includes a first substrate, first to third light-emitting elements disposed over the first substrate and each including a first-color emission layer and a second-color emission layer, an encapsulation layer covering the first to third light-emitting elements, a bank disposed on the encapsulation layer, where first to third bank openings are defined through the bank to respectively overlap the first to third light-emitting elements when viewed in a direction perpendicular to the first substrate, a quantum-dot layer disposed in the third bank opening to overlap the third light-emitting element when viewed in the direction perpendicular to the first substrate, a spacer disposed on the bank and including a same material as a material of the quantum-dot layer, a second substrate disposed over the first substrate with the bank and the spacer therebetween, a first color filter layer disposed on a lower surface of the second substrate facing the first substrate and overlapping the first light-emitting element when viewed in a direction perpendicular to the first substrate, a second color filter layer disposed on the lower surface of the second substrate facing the first substrate and overlapping the second light-emitting element when viewed in a direction perpendicular to the first substrate, and a third color filter layer disposed on the lower surface of the second substrate facing the first substrate and overlapping the third light-emitting element when viewed in the direction perpendicular to the first substrate.

In an embodiment, the quantum-dot layer may include a concave portion and a protrusion, the concave portion may be disposed in the third bank opening of the bank, and the protrusion may be disposed on a surface of the bank in a direction to the second substrate.

In an embodiment, the protrusion and the concave portion may be integrally formed in a single unitary and indivisible body.

In an embodiment, a distance between an upper surface of the first substrate facing the second substrate and an upper surface of the spacer facing the second substrate may be greater than a distance between the upper surface of the first substrate facing the second substrate and an upper surface of the protrusion facing the second substrate.

In an embodiment, the spacer and the protrusion may be integrally formed as a single unitary and indivisible body.

In an embodiment, the spacer may be apart from the quantum-dot layer when viewed in the direction perpendicular to the first substrate.

In an embodiment, the display apparatus may further include a first inorganic layer covering surfaces of the first to third color filter layers in the direction to the first substrate, and a second inorganic layer covering a portion of an upper surface of the bank facing the second substrate and an upper surface of the quantum-dot layer facing the second substrate, where the portion of the upper surface of the bank may be outside the quantum-dot layer and the spacer.

In an embodiment, each of the first color filter layer, the second color filter layer, and the quantum-dot layer may include scatterers.

In an embodiment, the bank may not include a liquid repellent or hydrophobic material.

In an embodiment, the first color filter layer may allow light from the first-color emission layer to pass therethrough, the second color filter layer may allow light from the second-color emission layer to pass therethrough, and the quantum-dot layer may convert a wavelength of light from the first-color emission layer or light from the second-color emission layer into a wavelength of light which the third color filter layer allows to pass therethrough.

In an embodiment, the third color filter layer may allow red light to pass therethrough.

According to one or more embodiments, a method of manufacturing a display apparatus includes providing first to third light-emitting elements over a first substrate, where each of the first to third light-emitting elements includes a first-color emission layer and a second-color emission layer, providing a bank, through which first to third bank openings are defined to respectively overlap the first to third light-emitting elements, and simultaneously forming a quantum-dot layer and a spacer, where the quantum-dot layer is provided in the third bank opening and the spacer is disposed on the bank.

In an embodiment, the method may further include providing a first color filter layer on a second substrate to overlap the first light-emitting element, providing a second color filter layer on the second substrate to overlap the second light-emitting element, and providing a third color filter layer on the second substrate to overlap the third light-emitting element, where the providing the bank may include forming the bank on the first to third color filter layers.

In an embodiment, the quantum-dot layer may include a concave portion and a protrusion, the concave portion may be provided in the third bank opening of the bank, and the protrusion may be provided on a surface of the bank in a direction to the first substrate.

In an embodiment, the protrusion and the concave portion may be integrally formed as a single unitary and indivisible body.

In an embodiment, a distance between a surface of the second substrate facing the first substrate and a surface of the spacer facing the first substrate may be greater than a distance between the surface of the second substrate facing the first substrate and a surface of the protrusion facing the first substrate.

In an embodiment, the spacer and the protrusion may be integrally formed as a single unitary and indivisible body.

In an embodiment, the spacer may be apart from the quantum-dot layer.

In an embodiment, the method may further include providing an encapsulation layer to cover the first to third light-emitting elements, where the providing the bank may include forming the bank on the encapsulation layer.

In an embodiment, the quantum-dot layer may include a concave portion and a protrusion, the concave portion may be provided in the third bank opening of the bank, and the protrusion may be provided on the bank.

In an embodiment, the protrusion and the concave portion may be integrally formed as a single unitary and indivisible body.

In an embodiment, a distance between an upper surface of the first substrate and an upper surface of the spacer may be greater than a distance between the upper surface of the first substrate and an upper surface of the protrusion.

In an embodiment, the spacer and the protrusion may be integrally formed as a single unitary and indivisible body.

In an embodiment, the spacer may be apart from the quantum-dot layer when viewed in a direction perpendicular to the first substrate.

In an embodiment, these and/or other features of embodiments of the invention will become apparent and more readily appreciated from the following description of the embodiments, the accompanying drawings, and claims.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
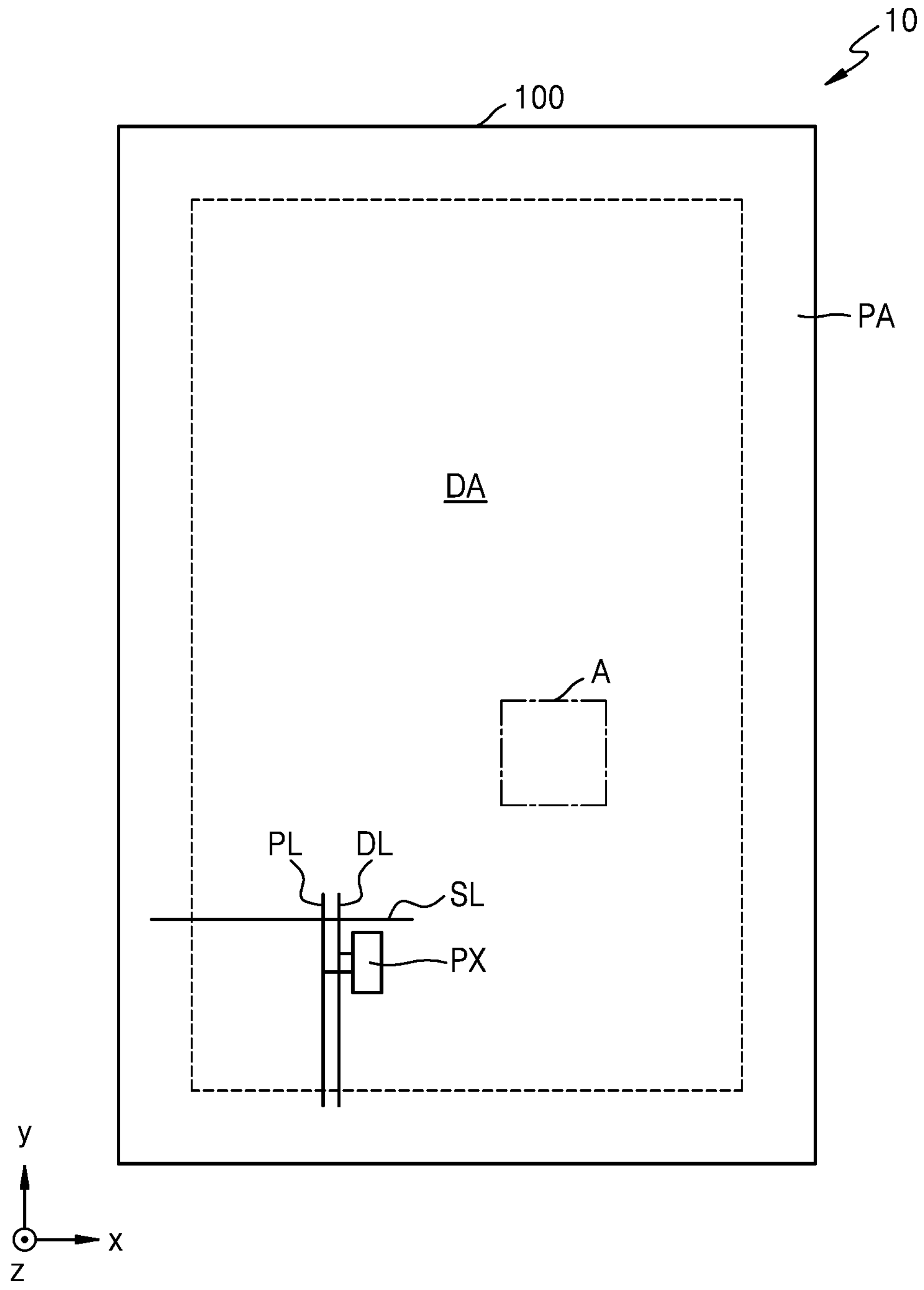
FIG. 1 is a schematic plan view of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms “first,” “second,” “third” etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, “a first element,” “component,” “region,” “layer” or “section” discussed below could be termed a second element, component, region, layer or section without departing from the teachings herein.

The terminology used herein is for the purpose of describing particular embodiments only and is not intended to be limiting. As used herein, “a”, “an,” “the,” and “at least one” do not denote a limitation of quantity, and are intended to include both the singular and plural, unless the context clearly indicates otherwise. For example, “an element” has the same meaning as “at least one element,” unless the context clearly indicates otherwise. “At least one” is not to be construed as limiting “a” or “an.” “Or” means “and/or.” As used herein, the term “and/or” includes any and all combinations of one or more of the associated listed items. Throughout the disclosure, the expression “at least one of a, b or c” or “at least one selected from a, b and c” indicates only a, only b, only c, both a and b, both a and c, both b and c, all of a, b, and c, or variations thereof. It will be further understood that the terms “comprises” and/or “comprising,” or “includes” and/or “including” when used in this specification, specify the presence of stated features, regions, integers, steps, operations, elements, and/or components, but do not preclude the presence or addition of one or more other features, regions, integers, steps, operations, elements, components, and/or groups thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

As used herein, when various elements such as a layer, a region, a plate, and the like are disposed “on” another element, not only the elements may be disposed “directly on” the other element, but another element may be disposed therebetween. In addition, sizes of elements in the drawings may be exaggerated or reduced for convenience of explanation. As an example, the size and thickness of each element shown in the drawings are arbitrarily represented for convenience of description, and thus, the disclosure is not necessarily limited thereto.

Furthermore, relative terms, such as “lower” or “bottom” and “upper” or “top,” may be used herein to describe one element’s relationship to another element as illustrated in the Figures. It will be understood that relative terms are intended to encompass different orientations of the device in addition to the orientation depicted in the Figures. For example, if the device in one of the figures is turned over, elements described as being on the “lower” side of other elements would then be oriented on “upper” sides of the other elements. The term “lower,” can therefore, encompasses both an orientation of “lower” and “upper,” depending on the particular orientation of the figure. Similarly, if the device in one of the figures is turned over, elements described as “below” or “beneath” other elements would then be oriented “above” the other elements. The terms “below” or “beneath” can, therefore, encompass both an orientation of above and below.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings.

FIG. 1 is a schematic plan view of a display apparatus according to an embodiment.

As shown in FIG. 1, the display apparatus according to an embodiment includes a display panel 10. As long as a display apparatus includes the display panel 10, an embodiment of the display apparatus may be any types of display apparatus or electronic device. In an embodiment, for example, the display apparatus may include various apparatuses such as smartphones, tablet computers, laptop computers, televisions, advertisement boards, or the like.

The display panel 10 may include a display area DA and a peripheral area PA outside the display area DA. It an embodiment, as shown in FIG. 1, the display area DA has a rectangular shape. However, the embodiment is not limited thereto. The display area DA may have various shapes, for example, circular shapes, elliptical shapes, polygonal shapes, or shapes of specific figures.

The display area DA is a region in which images are displayed, and a plurality of pixels PX may be arranged in the display area DA. Each pixel PX may include a light-emitting element such as an organic light-emitting diode. Each pixel PX may be configured to emit, for example, red, green, or blue light. The pixel PX may be connected to a pixel circuit including a thin-film transistor, a storage capacitor, or the like. The pixel circuit may be connected to a scan line SL, a data line DL, and a driving voltage line PL, where the scan line SL is configured to transfer scan signals, the data line DL crosses the scan line SL and is configured to transfer data signals, and the driving voltage line PL is configured to supply a driving voltage. The scan line SL may extend in an x-axis direction, and the data line DL and the driving voltage line PL may extend in a y axis direction crossing the x axis direction. In FIG. 1, a z axis direction may be a direction perpendicular to the x axis direction and the y axis direction, or a thickness direction of the display panel 10.

The pixel PX may be configured to emit light of a brightness corresponding to an electrical signal from the pixel circuit electrically connected thereto. The display area DA may be configured to display preset images by using light emitted from the pixel PX. In an embodiment, as described above, the pixel PX may be defined as a region that is configured to emit light having one of red, green, and blue color.

The peripheral area PA is a region in which pixels PX are not arranged and may be a region that is configured not to display images. A power supply line for driving the pixel PX or the like may be arranged in the peripheral area PA. In addition, a printed circuit board including a driving circuit portion or a terminal portion to which a driver integrated circuit (IC) is connected may be arranged in the peripheral area PA.

In an embodiment, because the display panel 10 includes a first substrate 100, it may be understood that the first substrate 100 includes the display area DA and the peripheral area PA, or the display area DA and the peripheral area PA are defined on the first substrate 100.

Figure 2:
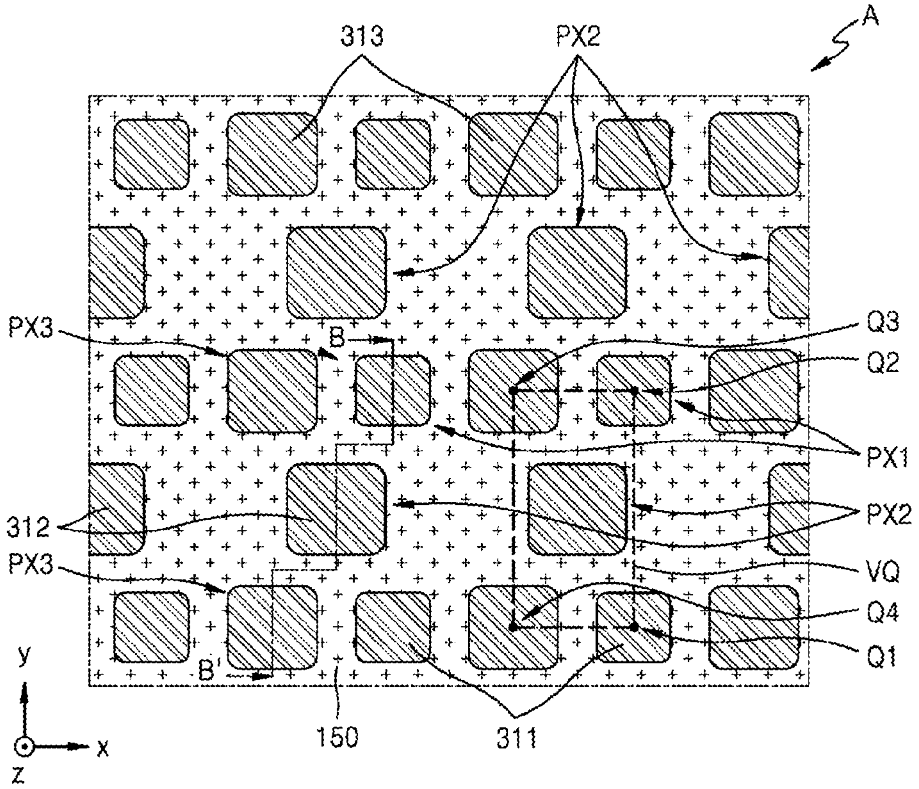
FIG. 2 is a schematic plan view of a portion of a display apparatus according to an embodiment.

FIG. 2 is a schematic plan view of a portion of the display apparatus according to an embodiment. FIG. 2 may be an enlarged plan view of a region A of FIG. 1. For reference, FIG. 2 shows a pixel-defining layer 150 exposing portions of first pixel electrodes 311, second pixel electrodes 312, and third pixel electrodes 313, and covering the edges of each of the first to third pixel electrodes 311, 312 and 313.

In an embodiment, as shown in FIG. 2, the display apparatus may include a plurality of pixels PX1, PX2, and PX3. The pixels PX1, PX2, and PX3 may include a first pixel PX1, a second pixel PX2, and a third pixel PX3 configured to respectively emit light of different colors. The first pixel PX1 may be a pixel configured to emit blue light, the second pixel PX2 may be a pixel configured to emit green light, and the third pixel PX3 may be a pixel configured to emit red light.

The first pixel PX1, the second pixel PX2, and the third pixel PX3 may each have a polygonal shape when viewed in a direction (a z axis direction) perpendicular to the first substrate 100. In an embodiment, as shown in FIG. 2, the first pixel PX1, the second pixel PX2, and the third pixel PX3 each have a quadrangular shape, specifically, a quadrangular shape having round edges when viewed in the direction (the z axis direction) perpendicular to the first substrate 100. In such an embodiment, a portion of each of the first pixel electrode 311 of the first pixel PX1, the second pixel electrode 312 of the second pixel PX2, and the third pixel electrode 313 of the third pixel PX3 exposed by the pixel-defining layer 150 may have a quadrangular shape having round edges.

However, the embodiment is not limited thereto. In an alternative embodiment, for example, each of the first pixel PX1, the second pixel PX2, and the third pixel PX3, that is, a portion of each of the first pixel electrode 311 of the first pixel PX1, the second pixel electrode 312 of the second pixel PX2, and the third pixel electrode 313 of the third pixel PX3 exposed by the pixel-defining layer 150 may have a circular shape, an elliptical shape, or a polygonal shape except for a quadrangular shape when viewed in the direction (the z axis direction) perpendicular to the first substrate 100. Alternatively, each of the first pixel PX1, the second pixel PX2, and the third pixel PX3, that is, a portion of each of the first pixel electrode 311 of the first pixel PX1, the second pixel electrode 312 of the second pixel PX2, and the third pixel electrode 313 of the third pixel PX3 exposed by the pixel-defining layer 150 may have a shape in which a quadrangle is chamfered, that is, an octagonal shape. In this case, the degree of the edges being chamfered may be different from each other. That is, all of the lengths of the octagon may not be the same as each other.

In an embodiment, when viewed in the direction (the z axis direction) perpendicular to the first substrate 100, the shape of each of the first pixel PX1, the second pixel PX2, and the third pixel PX3 may be defined by the first color filter layer 810, the second color filter layer 820, and/or the third color filter layer 830 (e.g., see FIG. 3) described below. Accordingly, the shape of each of the first pixel PX1, the second pixel PX2, and the third pixel PX3 defined by the first color filter layer 810, the second color filter layer 820, and/or the third color filter layer 830 may have a quadrangular shape having round edges, a circular shape, an elliptical shape, or a polygonal shape except for a quadrangular shape. In such an embodiment, a portion of each of the first pixel electrode 311 of the first pixel PX1, the second pixel electrode 312 of the second pixel PX2, and the third pixel electrode 313 of the third pixel PX3 exposed by the pixel-defining layer 150 may be different from the shape of each of the first pixel PX1, the second pixel PX2, and the third pixel PX3 defined by the first color filter layer 810, the second color filter layer 820, and/or the third color filter layer 830.

The sizes, that is, the areas of the first pixel PX1, the second pixel PX2, and the third pixel PX3, may be different from each other. In an embodiment, for example, the area of the second pixel PX2 may be greater than the area of the first pixel PX1 and the area of the third pixel PX3. In addition, the area of the first pixel PX1 may be less than the area of the third pixel PX3. In an embodiment, when viewed in the direction (the z axis direction) perpendicular to the first substrate 100, the area of each of the first pixel PX1, the second pixel PX2, and the third pixel PX3 may be defined by the first color filter layer 810, the second color filter layer 820, and/or the third color filter layer 830 as described below.

The first pixel PX1 may include the first pixel electrode 311, the second pixel PX2 may include the second pixel electrode 312, and the third pixel PX3 may include the third pixel electrode 313. The pixel-defining layer 150 covers the edges of each of the first pixel electrode 311, the second pixel electrode 312, and the third pixel electrode 313. That is, an opening exposing the central portion of the first pixel electrode 311, an opening exposing the central portion of the second pixel electrode 312, and an opening exposing the central portion of the third pixel electrode 313 may be defined through the pixel-defining layer 150. The third pixel PX3 may include a quantum-dot layer 630 (see FIG. 3) disposed over the third pixel electrode 313. This will be described below in greater detail.

The first pixel PX1, the second pixel PX2, and the third pixel PX3 may be arranged in a predetermined manner as shown in FIG. 2. In an embodiment, for example, assuming an imaginary quadrangle VQ with the second pixel PX2 centered at a center thereof, the first pixel PX1 may be arranged at a first vertex Q1, and the first pixel PX1 may be arranged also at a second vertex Q2 adjacent in the first direction (a y axis direction) to the first vertex Q1. In addition, the third pixel PX3 may be arranged at a third vertex Q3 symmetrical to the first vertex Q1 around the center of the imaginary quadrangle VQ, and the third pixel PX3 may be arranged also at a fourth vertex Q4 symmetrical to the second vertex Q2 around the center of the imaginary quadrangle VQ. The imaginary quadrangle VQ may be a rectangular shape.

The first pixel PX1 and the third pixel PX3 may be alternately arranged in a row extending in the second direction (an x axis direction) crossing the first direction (the y axis direction). In a row in which the second pixel PX2 is arranged, only the second pixels PX2 may be arranged in the second direction (the x axis direction). Pixels configured to emit light of the same color may be arranged in the first direction (the y axis direction). Accordingly, a column of the third pixels PX3 configured to emit red light, a column of the second pixels PX2 configured to emit green light, and a column of the first pixels PX1 configured to emit blue light may be alternately arranged in the second direction (the x axis direction).

Alternatively, the first pixel PX1, the second pixel PX2, and the third pixel PX3 may be arranged in a pentile configuration, a stripe configuration, a mosaic configuration, or an S-stripe configuration.

Figure 3:
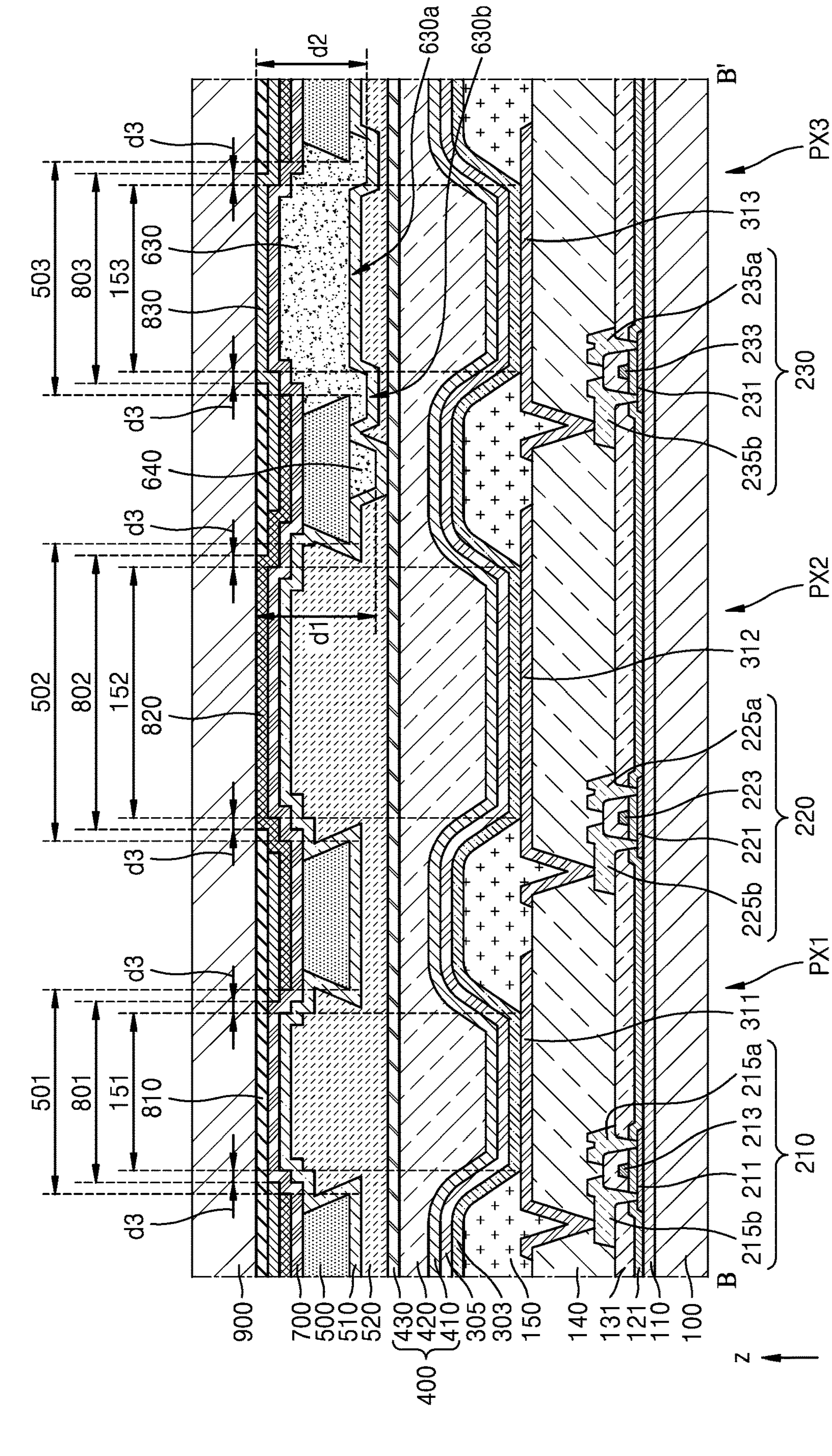
FIG. 3 is a schematic cross-sectional view of a display apparatus, taken along line B-B' of FIG. 2.

FIG. 3 is a schematic cross-sectional view of a display apparatus, taken along line B-B' of FIG. 2. An embodiment of the display apparatus may include the first substrate 100, the first pixel electrode 311, the second pixel electrode 312, the third pixel electrode 313, the pixel-defining layer 150, an encapsulation layer 400, a second substrate 900, a bank 500, the quantum-dot layer 630, and a spacer 640.

The first substrate 100 may include glass, metal, or a polymer resin. The first substrate 100 may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The first substrate 100 may have a multi-layered structure including two layers each including the polymer resin, and a barrier layer including an inorganic material (such as silicon oxide, silicon nitride, and silicon oxynitride) therebetween. However, various modifications may be made thereto.

The first pixel electrode 311, the second pixel electrode 312, and the third pixel electrode 313 are disposed over the first substrate 100. In addition to the first pixel electrode 311, the second pixel electrode 312, and the third pixel electrode 313, a first thin-film transistor 210, a second thin-film transistor 220, and a third thin-film transistor 230 respectively connected to the first pixel electrode 311, the second pixel electrode 312, and the third pixel electrode 313 may be disposed over the first substrate 100. That is, as shown in FIG. 3, the first pixel electrode 311 may be electrically connected to the first thin-film transistor 210, the second pixel electrode 312 may be electrically connected to the second thin-film transistor 220, and the third pixel electrode 313 may be electrically connected to the third thin-film transistor 230. The first pixel electrode 311, the second pixel electrode 312, and the third pixel electrode 313 may be disposed on a planarization layer 140 that is disposed over the first substrate 100 as described below.

The first thin-film transistor 210 may include a first semiconductor layer 211, a first gate electrode 213, a first source electrode **215*a*, and a first drain electrode 215*b*, where the first semiconductor layer 211 includes amorphous silicon, polycrystalline silicon, an organic semiconductor material, or an oxide semiconductor material. The first gate electrode 213 may include various conductive materials and have various layered structures, and include, for example, a Mo layer and an Al layer. In this case, the first gate electrode 213 may have a layered structure of Mo/Al/Mo. Alternatively, the first gate electrode 213 may include a $TiN_x$ layer, an Al layer, and/or a Ti layer. The first source electrode 215*a* and the first drain electrode 215*b* may also include various conductive materials and various layered structures, and may include, for example, a Ti layer, an Al layer, and/or a Cu layer. In this case, the first source electrode 215*a* and the first drain electrode 215*b*** may each have a layered structure of Ti/Al/Ti.

Although it is shown in FIG. 3 that the first thin-film transistor 210 includes both the first source electrode **215*a* and the first drain electrode 215*b*, the embodiment is not limited thereto. In an embodiment, for example, a source region of the first semiconductor layer 211 of the first thin-film transistor 210 and a drain region of a semiconductor layer of another thin-film transistor may be integrally formed as a single unitary and indivisible body. In this case, the first thin-film transistor 210 may not include the first source electrode 215*a*. The first source electrode 215*a* and/or the first drain electrode 215*b*** may be defined by a portion of a wiring.

To secure insulation between the first semiconductor layer 211 and the first gate electrode 213, a gate insulating layer 121 may be disposed between the first semiconductor layer 211 and the first gate electrode 213, where the gate insulating layer 121 includes an inorganic material such as silicon oxide, silicon nitride, and/or silicon oxynitride. In addition, an interlayer insulating layer 131 may be disposed on the first gate electrode 213, wherein the interlayer insulating layer 131 includes an inorganic material such as silicon oxide, silicon nitride, and/or silicon oxynitride. The first source electrode **215*a* and the first drain electrode 215*b* may be disposed on the interlayer insulating layer 131**. The insulating layer including the inorganic material may be formed by chemical vapor deposition (CVD) or atomic layer deposition (ALD). This is also applicable to embodiments below and modifications thereof.

A buffer layer 110 may be disposed between the first thin-film transistor 210 having the above structure and the first substrate 100, where the buffer layer 110 includes an inorganic material such as silicon oxide, silicon nitride, and/or silicon oxynitride. The buffer layer 110 may increase flatness of the upper surface of the first substrate 100, or prevent or reduce impurities from the first substrate 100 penetrating the first semiconductor layer 211 of the first thin-film transistor 210.

The second thin-film transistor 220 located in the second pixel PX2 may include a second semiconductor layer 221, a second gate electrode 223, a second source electrode **225*a*, and a second drain electrode 225*b*. The third thin-film transistor 230 located in the third pixel PX3 may include a third semiconductor layer 231, a third gate electrode 233, a third source electrode 235*a*, and a third drain electrode 235*b*. Because the structure of the second thin-film transistor 220 and the structure of the third thin-film transistor 230 are the same as or similar to the structure of the first thin-film transistor 210 located in the first pixel PX1**, any repetitive detailed descriptions thereof are omitted.

The planarization layer 140 may be disposed on the first thin-film transistor 210. In an embodiment, as shown in FIG. 3, where a first light-emitting element including the first pixel electrode 311 is disposed over the first thin-film transistor 210, the planarization layer 140 covering the first thin-film transistor 210 may have an approximately flat upper surface, allowing the first pixel electrode 311 of the first light-emitting element to be disposed on the flat surface. The planarization layer 140 may include, for example, acryl, benzocyclobutene (BCB), or hexamethyldisiloxane (HMDSO). Although it is shown in FIG. 3 that the planarization layer 140 is a single layer, the planarization layer 140 may be a multi-layer. However, various modifications may be made thereto.

The first light-emitting element, which is an organic light-emitting element, may be arranged in the first pixel PX1, where the organic light-emitting element includes the first pixel electrode 311, an opposite electrode 305, and an intermediate layer 303 disposed therebetween, where the intermediate layer 303 includes an emission layer. As shown in FIG. 3, the first pixel electrode 311 may be electrically connected to the first thin-film transistor 210 by contacting one of the first source electrode 215*a* and the first drain electrode 215*b* through a contact hole defined or formed in the planarization layer 140 and the like. The first pixel electrode 311 may include a light-transmissive conductive layer and a reflective layer, where the light-transmissive conductive layer includes a light-transmissive conductive oxide such as indium tin oxide (ITO), indium oxide ($In_2O_3$), or indium zinc oxide (IZO), and the reflective layer includes metal such as aluminum (Al) or silver (Ag). In an embodiment, for example, the first pixel electrode 311 may have a three-layered structure of ITO/Ag/ITO.

The second light-emitting element, which is an organic light-emitting element, may be arranged in the second pixel PX2, where the organic light-emitting element includes the second pixel electrode 312, the opposite electrode 305, and the intermediate layer 303 disposed therebetween, where the intermediate layer 303 includes the emission layer. The third light-emitting element, which is an organic light-emitting element, may be arranged in the third pixel PX3, where the organic light-emitting element includes the third pixel electrode 313, the opposite electrode 305, and the intermediate layer 303 disposed therebetween, where the intermediate layer 303 includes the emission layer. The second pixel electrode 312 may be electrically connected to the second thin-film transistor 220 by contacting one of the second source electrode 225*a* and the second drain electrode 225*b* through a contact hole defined or formed in the planarization layer 140 and the like. The third pixel electrode 313 may be electrically connected to the third thin-film transistor 230 by contacting one of the third source electrode 235*a* and the third drain electrode 235*b* through a contact hole defined or formed in the planarization layer 140 and the like. The description of the first pixel electrode 311 is applicable to the second pixel electrode 312 and the third pixel electrode 313.

In an embodiment, as described above, the intermediate layer 303 including the emission layer may be disposed also on the second pixel electrode 312 of the second pixel PX2 and the third pixel electrode 313 of the third pixel PX3 as well as the first pixel electrode 311 of the first pixel PX1. The intermediate layer 303 may be integrally formed as a single unitary and indivisible body over the first pixel electrode 311, the second pixel electrode 312, and the third pixel electrode 313. Alternatively, if desired, the intermediate layer 303 may be patterned on the first pixel electrode 311, the second pixel electrode 312, and the third pixel electrode 313. In addition to the emission layer, the intermediate layer 303 may include a hole injection layer, a hole transport layer, and/or an electron transport layer when needed. The layers included in the intermediate layer 303 may be integrally formed as a single unitary and indivisible body over the first pixel electrode 311, the second pixel electrode 312, and the third pixel electrode 313. Alternatively, if desired, some of the layers included in the intermediate layer 303 may be patterned and disposed on the first pixel electrode 311, the second pixel electrode 312, and the third pixel electrode 313.

The emission layer of the intermediate layer 303 may be configured to emit light having a wavelength in a first wavelength band and light having a wavelength in a second wavelength band. The first wavelength band may be in a range from about 450 nanometers (nm) to about 495 nm, and the second wavelength band may be in a range from about 495 nm to about 570 nm. The emission layer may include a material configured to emit light in the first wavelength band and a material configured to emit light in the second wavelength band. In such an embodiment, it may be understood that the emission layer of the intermediate layer 303 may include a first-color emission layer and a second-color emission layer. That is, the first-color emission layer and the second-color emission layer may be integrally formed as a single unitary and indivisible body. In an alternative embodiment, for example, the intermediate layer 303 may include a plurality of emission layers, not a single emission layer. In an embodiment, for example, the intermediate layer 303 may have a structure in which the first-color emission layer and the second-color emission layer are stacked, and a charge generation layer is disposed between the first-color emission layer and the second-color emission layer, the first-color emission layer and the second-color emission layer being mutually discriminated from each other. In an embodiment, a hole transport layer or an electron transport layer may be disposed between the first-color emission layer and the charge generation layer and between the second-color emission layer and the charge generation layer. The first-color emission layer may include a material configured to emit light in the first wavelength band, and the second-color emission layer may include a material configured to emit light in the second wavelength band.

The opposite electrode 305 over the intermediate layer 303 may also be integrally formed as a single unitary and indivisible body over the first pixel electrode 311 to third pixel electrode 313. The opposite electrode 305 may include a light-transmissive conductive layer including ITO, $In_2O_3$, or IZO, and include a semi-transmissive layer including metal such as aluminum (Al), lithium (Li), magnesium (Mg), ytterbium (Yb), or silver (Ag). In an embodiment, for example, the opposite electrode 305 may be a semi-transmissive layer including MgAg, AgYb, Yb/MgAg, or Li/MgAg.

The pixel-defining layer 150 may be disposed on the planarization layer 140. The pixel-defining layer 150 may be provided with pixel openings respectively corresponding to the pixels. That is, the pixel-defining layer 150 covers the edges of each of the first pixel electrode 311, the second pixel electrode 312, and the third pixel electrode 313, and a first pixel opening 151 that exposes the central portion of the first pixel electrode 311, a second pixel opening 152 that exposes the central portion of the second pixel electrode 312, and a third pixel opening 153 that exposes the central portion of the third pixel electrode 313 are defined through the pixel-defining layer 150. As shown in FIG. 3, the pixel-defining layer 150 may prevent arcs and the like from occurring at the edges of the first pixel electrode 311, the second pixel electrode 312, and the third pixel electrode 313 by increasing a distance between the opposite electrode 305 and the edges of each of the first pixel electrode 311, the second pixel electrode 312, and the third pixel electrode 313. The pixel-defining layer 150 may include an organic material such as polyimide or HMDSO.

The first to third light-emitting elements, which are organic light-emitting elements including the first pixel electrode 311, the second pixel electrode 312, the third pixel electrode 313, the intermediate layer 303 including the emission layer, and the opposite electrode 305, may be easily deteriorated by moisture or oxygen. Accordingly, to protect the first to third light-emitting elements from external moisture or oxygen, the display apparatus may include the encapsulation layer 400 covering the first to third light-emitting elements.

The encapsulation layer 400 may include at least one inorganic encapsulation layer and at least one organic encapsulation layer. In an embodiment, for example, the encapsulation layer 400 may include a first inorganic encapsulation layer 410, a second inorganic encapsulation layer 430, and an organic encapsulation layer 420 therebetween.

The first inorganic encapsulation layer 410 and the second inorganic encapsulation layer 430 may each include at least one inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), and be formed by chemical vapor deposition (CVD). The organic encapsulation layer 420 may include a polymer-based material. The polymer-based material may include an acryl-based resin (e.g., polymethyl methacrylate, polyacrylic acid, and the like), an epoxy-based resin, polyimide, and polyethylene.

In an embodiment where the first inorganic encapsulation layer 410 is formed by chemical vapor deposition to have an approximately uniform thickness, the upper surface thereof may not be flat as shown in FIG. 3. In such an embodiment, the organic encapsulation layer 420 has an approximately flat upper surface, and thus, the second inorganic encapsulation layer 430 on the organic encapsulation layer 420 may also have an approximately flat upper surface.

The second substrate 900 may be disposed over the first substrate 100 such that the first to third light-emitting elements are disposed therebetween, where the first to third light-emitting elements include the first pixel electrode 311, the second pixel electrode 312, the third pixel electrode 313, the intermediate layer 303, and the opposite electrode 305. The second substrate 900 may include glass, metal, or a polymer resin. The second substrate 900 may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The second substrate 900 may have a multi-layered structure including two layers each including the polymer resin, and a barrier layer including an inorganic material (such as silicon oxide, silicon nitride, and silicon oxynitride) therebetween. However, various modifications may be made thereto.

The bank 500 is disposed below the lower surface of the second substrate 900 in a direction (a-z direction) to the first substrate 100. In an embodiment, a first bank opening 501, a second bank opening 502, and a third bank opening 503 are defined through the bank 500. The bank openings of the bank 500 may correspond to the light-emitting elements. In an embodiment, the first bank opening 501 of the bank 500 may correspond to the first pixel opening 151 of the pixel-defining layer 150 exposing the first pixel electrode 311, the second bank opening 502 of the bank 500 may correspond to the second pixel opening 152 of the pixel-defining layer 150 exposing the second pixel electrode 312, and the third bank opening 503 of the bank 500 may correspond to the third pixel opening 153 of the pixel-defining layer 150 exposing the third pixel electrode 313.

In such an embodiment, when viewed in a direction (a z axis direction) perpendicular to the first substrate 100, the first bank opening 501 of the bank 500 may overlap the first pixel opening 151 of the pixel-defining layer 150 that exposes the first pixel electrode 311, the second bank opening 502 of the bank 500 may overlap the second pixel opening 152 of the pixel-defining layer 150 that exposes the second pixel electrode 312, and the third bank opening 503 of the bank 500 may overlap the third pixel opening 153 of the pixel-defining layer 150 that exposes the third pixel electrode 313. Accordingly, when viewed in the direction (the z axis direction) perpendicular to the first substrate 100, the shape of the edges of each of the first to third bank openings 501, 502, and 503 of the bank 500 may be the same as or similar to the shape of the edges of corresponding pixel openings of the pixel-defining layer 150. Accordingly, the first bank opening 501 of the bank 500 may correspond to the first pixel electrode 311, the second bank opening 502 of the bank 500 may correspond to the second pixel electrode 312, and the third bank opening 503 of the bank 500 may correspond to the third pixel electrode 313.

In such an embodiment, when viewed in the direction (the z axis direction) perpendicular to the first substrate 100, the area of the first bank opening 501 of the bank 500 is greater than the area of the first pixel opening 151 of the pixel-defining layer 150, the area of the second bank opening 502 of the bank 500 is greater than the area of the second pixel opening 152 of the pixel-defining layer 150, and the area of the third bank opening 503 of the bank 500 is greater than the area of the third pixel opening 153 of the pixel-defining layer 150. In such an embodiment, light generated from the first pixel opening 151 of the pixel-defining layer 150 may be sufficiently (or effectively) incident into the first bank opening 501 of the bank 500, light generated from the second pixel opening 152 of the pixel-defining layer 150 may be sufficiently incident into the second bank opening 502 of the bank 500, and light generated from the third pixel opening 153 of the pixel-defining layer 150 may be sufficiently incident into the third bank opening 503 of the bank 500.

The bank 500 may include various materials, for example, acryl, BCB, or HMDSO. Alternatively, if desired, the bank 500 may include a photoresist material, such that the bank 500 may be easily formed by processes such as exposure and developing processes. During a manufacturing process, the bank 500 with the first to third bank openings 501, 502, and 503 may be formed on the second substrate 900, the quantum-dot layer 630 described below may be formed on the third bank opening 503 of the bank 500, and then the first substrate 100 may be attached to the second substrate 900 with an adhesive member or the like. Because the bank 500 is formed on the second substrate 900 through processes such as exposure and developing processes, the area of a surface of the bank 500 in a direction (a-z direction) to the first substrate 100 may be greater than the area of a surface of the bank 500 in a direction (a +z direction) of the second substrate 900. Accordingly, as shown in FIG. 3, the cross-sectional area of the bank 500 increases as being away from the second substrate 900, and the bank 500 may have a reverse tapered shape with respect to the second substrate 900.

The quantum-dot layer 630 may be disposed in the third bank opening 503 of the bank 500. The quantum-dot layer 630 may overlap the third pixel electrode 313 when viewed in the direction (the z axis direction) perpendicular to the first substrate 100. That is, when viewed in the direction (the z axis direction) perpendicular to the first substrate 100, the quantum-dot layer 630 may overlap the third light-emitting element. Because the quantum-dot layer 630 include quantum dots that may convert the wavelength of incident light, the quantum-dot layer 630 may be configured to convert light in the first wavelength band or the second wavelength band passing through the quantum-dot layer 630 into light in a third wavelength band. The third wavelength band may be, for example, in a range from about 625 nm to about 780 nm. That is, light in the third wavelength band may be red light. The embodiment is not limited thereto, and the wavelength band to which a wavelength, that is, a target the quantum-dot layer 630 converts, belongs, and the wavelength band to which a wavelength after the conversion belongs, may be modified differently.

The quantum-dot layer 630 may have a configuration in which quantum dots are dispersed in resin. In an embodiment, embodiments described below, and modified examples thereof, quantum dots denotes crystals of a semiconductor compound, and may include an arbitrary material that may emit light in various wavelength bands depending on the size of the crystals. A diameter of the quantum dots may be, for example, in a range from about 1 nm to about 10 nm.

Quantum dots may be synthesized by a wet chemical process, a metal organic chemical vapor deposition process, a molecular beam epitaxy process, or a similar process. A wet chemical process is a method of mixing an organic solvent with a precursor material and then growing quantum dot crystals. In a wet chemical process, when the crystal grows, the organic solvent naturally acts as a dispersant coordinated on the surface of the quantum dot crystal and controls the growth of the crystal. Accordingly, the wet chemical process is easier than vapor deposition such as metal organic chemical vapor deposition (MOCVD) or molecular beam epitaxy (MBE). In addition, the wet chemical process may be configured to control the growth of the quantum dots at low costs.

The quantum-dot may include one of a Group II-VI semiconductor compound, a Group III-V semiconductor compound, a Group III-VI semiconductor compound, a Group I-III-VI semiconductor compound, a Group IV-VI semiconductor compound, a Group IV element or compound, and an arbitrary combination thereof.

Examples of a Group II-VI semiconductor compound may include one of a two-element compound including CdS, CdSe, CdTe, ZnS, ZnSe, ZnTe, ZnO, HgS, HgSe, HgTe, MgSe or MgS, a three-element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe or MgZnS, a four-element compound including CdZnSeS, CdZnSeTe, CdZnSTe, CdHgSeS, CdHgSeTe, CdHgSTe, HgZnSeS, HgZnSeTe, HgZnSTe and the like, and an arbitrary combination thereof.

Examples of a Group III-V semiconductor compound may include one of a two-element compound including GaN, GaP, GaAs, GaSb, AlN, AlP, AlAs, AlSb, InN, InP, InAs, and InSb, a three-element compound including GaNP, GaNAs, GaNSb, GaPAs, GaPSb, AlNP, AlNAs, AlNSb, AlPAs, AlPSb, InGaP, InNP, InAlP, InNAs, InNSb, InPAs, and InPSb, and a four-element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb, and an arbitrary combination thereof. A Group III-V semiconductor compound may further include a Group II element. Examples of a Group III-V semiconductor compound further including a Group II element may include InZnP, InGaZnP, or InAlZnP.

Examples of a Group III-VI semiconductor compound may include one of a two-element compound including GaS, GaSe, $Ga_2Se_3$, GaTe, InS, $In_2S_3$, InSe, $In_2Se_3$, and InTe, and a three-element compound including AgInS, $AgInS_2$, CuInS, $CuInS_2$, $InGaS_3$, and $InGaSe_3$, and an arbitrary combination thereof.

Examples of a Group I-III-VI semiconductor compound may include one of a three-element compound including AgInS, $AgInS_2$, CuInS, $CuInS_2$, $CuGaO_2$, $AgGaO_2$, or $AgAlO_2$, and an arbitrary combination thereof.

Examples of a Group IV-VI semiconductor compound may include a two-element compound including SnS, SnSe, SnTe, PbS, PbSe, or PbTe, a three-element compound including SnSeS, SnSeTe, SnSTe, PbSeS, PbSeTe, PbSTe, SnPbS, SnPbSe, or SnPbTe, a four-element compound including SnPbSSe, SnPbSeTe, or SnPbSTe, or an arbitrary combination thereof.

A Group IV element or compound may include one of a single-element compound including Si or Ge, or a two-element compound including SiC or SiGe, and an arbitrary combination thereof.

Each element included in a multi-element compound such as a two-element compound, a three-element compound, and a four-element compound may be present in a particle in a uniform concentration or a non-uniform concentration.

A quantum-dot may have a single structure in which the concentration of each element included in the relevant quantum-dot is uniform, or a double structure of a core-shell. In an embodiment, for example, a material of the core may be different from a material of the shell. The shell of a quantum-dot may serve as a protective layer that prevents a chemical change of the core to maintain a semiconductor characteristic and/or serve as a charging layer for giving an electrophoretic characteristic to the quantum dot. The shell may include a single layer or a multi-layer. An interface between the core and the shell may have a concentration gradient in which the concentration of an element existing in the shell reduces toward the center.

Examples of the shell of the quantum-dot include oxide of metal or non-metal, a semiconductor compound, or a combination thereof. Examples of oxides of metals or non-metals may include one of a two-element compound including $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and a three-element compound including $MgAl_2O_4$, $CoFe_2O_4$, $NiFe_2O_4$, $CoMn_2O_4$, and an arbitrary combination thereof. Examples of the semiconductor compound may include, as described above, a Group II-VI semiconductor compound, a Group III-V semiconductor compound, a Group III-VI semiconductor compound, a Group I-III-VI semiconductor compound, and a Group IV-VI semiconductor compound, and an arbitrary combination thereof. In an embodiment, for example, the semiconductor compound may include one of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and an arbitrary combination thereof.

A quantum-dot may have a full width of half maximum (FWHM) of a light emission wavelength spectrum of 45 nm or less, specifically about 40 nm or less, and more specifically about 30 nm or less. When the FWHM is in this range, color purity or color reproduction may be improved. In addition, because light emitted from the quantum-dot is emitted in all directions, a viewing angle of light may be improved.

In addition, the shape of the quantum-dot may be a spherical shape, a pyramid shape, a multi-arm shape, a cubic shape, a nanoparticle, a nanotube, a nanowire, a nanofiber, a nano plate particle, or the like.

Because an energy band gap may be adjusted by adjusting the size of the quantum dot, light in a desired wavelength band may be obtained from the quantum-dot emission layer. Accordingly, a light-emitting element that emits light in various wavelengths may be implemented by using quantum dots of different sizes. In an embodiment, for example, the size of the quantum-dot may be selected such that light in the third wavelength band is emitted. The third wavelength band may be, for example, in a range from about 625 nm to about 780 nm.

The quantum-dot layer 630 may include scatters. By allowing incident light to be scattered by the scatterers of the quantum-dot layer 630, the incident light may be efficiently converted in the quantum-dot layer 630 by the quantum dots. As long as the scatterers include a material that may form an optical interface with light transmissive resin of the quantum-dot layer 630 and partially scatter transmitted light, scatterers are not particularly limited. In an embodiment, for example, the scatterers may be metal oxide particles or organic particles. Examples of metal oxides for scatterers include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). Examples of an organic material for the scatterers include an acrylic resin or a urethane resin. The scatterers may scatter light in various directions regardless of an incident angle while substantially not converting the wavelength of incident light, such that the scatterers may improve the lateral visibility of the display apparatus. In addition, the scatterers of the quantum-dot layer 630 may increase a light-converting efficiency by increasing a probability that light incident to the quantum-dot layer 630 meets the quantum dots.

For a resin used for the quantum-dot layer 630, any material may be used as long as the material has a high dispersion characteristic for the scatterers and a light-transmissive characteristic. In an embodiment, for example, a polymer resin such as an acryl-based resin, an imide-based resin, an epoxy-based resin, BCB, or HMDSO may be used in forming the quantum-dot layer 630. The quantum-dot layer 630 including the resin, the scatterers, and the quantum dots may be disposed in the third bank opening 503. As shown in FIG. 3, the quantum-dot layer 630 may include a concave (or recessed) portion 630*a* and a protrusion 630*b*, where the concave portion 630*a* is disposed in the third bank opening 503 of the bank 500, and the protrusion 630*b* is disposed on the surface of the bank 500 in the direction (the −z direction) to the first substrate 100. In a plan view, the protrusion 630*b* may surround the concave portion 630*a*. This is because the protrusion 630*b* may surround the third bank opening 503 of the bank 500. As shown in FIG. 3, the concave portion 630*a* and the protrusion 630*b* may be integrally formed as a single unitary and indivisible body.

The spacer 640 may be disposed on the lower surface of the bank 500 in the direction (the −z direction) to the first substrate 100. The spacer 640 may include the same material as a material of the quantum-dot layer 630. Accordingly, the spacer 640 and the quantum-dot layer 630 may include the same material as each other and be simultaneously formed during a same manufacturing process. The spacer 640 may maintain a constant interval between a stack body on the first substrate 100 and a stack body on the second substrate 900. In such an embodiment, a distance d1 between the lower surface of the second substrate 900 and the lower surface of the spacer 640 in the direction (the −z direction) to the first substrate 100 may be greater than a distance d2 between the lower surface of the second substrate 900 and the lower surface of the protrusion 630*b* in the direction (the −z direction) to the first substrate 100.

The spacer 640 may be apart from the quantum-dot layer 630 as shown in FIG. 3. Because the spacer 640 is apart from the quantum-dot layer 630 including a same material as a material of the spacer 640 and simultaneously formed with the spacer 640, mechanical strength of the spacer 640 may be increased. In an embodiment, for example, when viewed in the direction (the z axis direction) perpendicular to the first substrate 100, the spacer 640 may have an isolated shape.

Color filter layers may be disposed between the second substrate 900 and the bank 500. When viewed in the direction perpendicular to the first substrate 100, the first color filter layer 810 may be arranged in the first pixel PX1 to overlap the first light-emitting element. When viewed in the direction perpendicular to the first substrate 100, the second color filter layer 820 may be arranged in the second pixel PX2 to overlap the second light-emitting element. When viewed in the direction perpendicular to the first substrate 100, the third color filter layer 830 may be arranged in the third pixel PX3 to overlap the third light-emitting element.

As described above, because the emission layer of the intermediate layer 303 arranged in the first pixel PX1, the second pixel PX2, and the third pixel PX3 includes the first-color emission layer and the second-color emission layer, the emission layer may be configured to emit light in the first wavelength band and light in the second wavelength band. The first color filter layer 810 arranged in the first pixel PX1 may be configured to allow only light in the first wavelength band among light in the first wavelength band and light in the second wavelength band emitted from the emission layer arranged in the first pixel PX1 to pass therethrough. The second color filter layer 820 arranged in the second pixel PX2 may be configured to allow only light in the second wavelength band among light in the first wavelength band and light in the second wavelength band emitted from the emission layer arranged in the second pixel PX2 to pass therethrough. The third color filter layer 830 arranged in the third pixel PX3 may be configured to allow only light in the third wavelength band emitted from the quantum-dot layer 630 to pass therethrough. Accordingly, light in the first wavelength band may be emitted from the first pixel PX1, light in the second wavelength band may be emitted from the second pixel PX2, and light in the third wavelength band may be emitted from the third pixel PX3. The first wavelength band may be, for example, in a range from about 450 nm to about 495 nm, the second wavelength band may be, for example, in a range from about 495 nm to about 570 nm, and the third wavelength band may be, for example, in a range from about 625 nm to about 780 nm.

As described above, the first color filter layer 810 and the second color filter layer 820 allow the display apparatus to display full-color images. The third color filter layer 830 may enhance the quality of displayed images by enhancing the color purity of light emitted to the outside. In addition, the first to third color filter layers 810, 820, and 830 may reduce external light reflection by reducing a rate in which external light incident to the display apparatus from the outside is reflected by the first to third pixel electrodes 311, 312, and 313 and then emitted again to the outside. A black matrix may be disposed between the first to third color filter layers 810, 820, and 830 if desired.

As shown in FIG. 3, a second filter opening 802 corresponding to the second light-emitting element may be defined through the first color filter layer 810. The second filter opening 802 of the first color filter layer 810 may define a region of the second pixel PX2. That is, when viewed in the direction perpendicular to the first substrate 100, the shape and size of the second pixel PX2 may be defined by the second filter opening 802 of the first color filter layer 810. The second color filter layer 820 fills at least the second filter opening 802 of the first color filter layer 810.

In addition, as shown in FIG. 3, a third filter opening 803 corresponding to the third light-emitting element may be defined through the first color filter layer 810. The third filter opening 803 of the first color filter layer 810 may define a region of the third pixel PX3. That is, when viewed in the direction perpendicular to the first substrate 100, the shape and size of the third pixel PX3 may be defined by the third filter opening 803 of the first color filter layer 810. The third color filter layer 830 fills at least the third filter opening 803 of the first color filter layer 810.

A first filter opening 801 corresponding to the first light-emitting element may be defined through the third color filter layer 830. The first filter opening 801 of the third color filter layer 830 may define a region of the first pixel PX1. That is, when viewed in the direction perpendicular to the first substrate 100, the shape and size of the first pixel PX1 may be defined by the first filter opening 801 of the third color filter layer 830. The first color filter layer 810 fills at least the first filter opening 801 of the third color filter layer 830. Similar to the first color filter layer 810 having the second filter opening 802, the third color filter layer 830 may be provided with an additional filter opening corresponding to the second light-emitting element as shown in FIG. 3. The second color filter layer 820 may fill the second filter opening 802 of the first color filter layer 810 and the additional filter opening of the third color filter layer 830.

Because the first color filter layer 810 defines a region of the second pixel PX2 and a region of the third pixel PX3 through the second filter opening 802 and the third filter opening 803, the first color filter layer 810 may be a filter-defining layer in the second pixel PX2 and the third pixel PX3. Likewise, because the third color filter layer 830 defines a region of the first pixel PX1 through the first filter opening 801, the third color filter layer 830 may be a filter-defining layer in the first pixel PX1. The filter-defining layers may be referred to as pixel area-defining layers.

In such an embodiment, when viewed in the direction (the z axis direction) perpendicular to the first substrate 100, the area of the first filter opening 801 of the third color filter layer 830 is greater than the area of the first pixel opening 151 of the pixel-defining layer 150, the area of the second filter opening 802 of the first color filter layer 810 is greater than the area of the second pixel opening 152 of the pixel-defining layer 150, and the area of the third filter opening 803 of the first color filter layer 810 is greater than the area of the third pixel opening 153 of the pixel-defining layer 150. In such an embodiment, as shown in FIG. 3, when viewed in the direction (the z axis direction) perpendicular to the first substrate 100, a distance d3 between the edge of the first filter opening 801 and the edge of the first pixel opening 151 may be defined.

Through the relationship between the area of the filter openings of the color filter layer and the area of the pixel openings of the pixel-defining layer 150, light generated from the first pixel opening 151 of the pixel-defining layer 150 may be sufficiently incident into the first filter opening 801 of the third color filter layer 830, light generated from the second pixel opening 152 of the pixel-defining layer 150 may be sufficiently incident into the second filter opening 802 of the first color filter layer 810, and light generated from the third pixel opening 153 of the pixel-defining layer 150 may be sufficiently incident into the third filter opening 803 of the first color filter layer 810 through the quantum-dot layer 630.

A portion in which two or more color filter layers overlap each other may serve as the black matrix. In an embodiment, for example, where the first color filter layer 810 is configured to pass only light in a wavelength band of about 450 nm to about 495 nm, and the second color filter layer 820 is configured to pass only light in a wavelength band of about 625 nm to about 780 nm, there is no light in a portion where the first color filter layer 810 overlaps the second color filter layer 820 that may pass through both the first color filter layer 810 and the second color filter layer 820, theoretically. Because there is a portion where all of the first color filter layer 810, the second color filter layer 820, and the third color filter layer 830 overlap each other among the first pixel PX1, the second pixel PX2, and the third pixel PX3, the color filters may effectively serve as the black matrix among the first pixel PX1, the second pixel PX2, and the third pixel PX3.

As described above, the quantum-dot layer 630 arranged in the third pixel PX3 may include the scatterers. To display uniform high-quality images, scatterers may be arranged in the first pixel PX1 and the second pixel PX2. In an embodiment, the first color filter layer 810 and the second color filter layer 820 may each include the scatterers. The scatterers of the first color filter layer 810 and the second color filter layer 820 may be the same as or similar to the scatterers of the quantum-dot layer 630. The scatterers of the first color filter layer 810 and the second color filter layer 820 may be configured to scatter incident light in various directions regardless of an incident angle while substantially not converting the wavelength of the incident light, such that the scatterers may improve the lateral visibility of the display apparatus.

A first inorganic layer 700 may be disposed between the first color filter layer 810, the second color filter layer 820, and the third color filter layer 830, and the bank 500. The first inorganic layer 700 may be disposed also between the first color filter layer 810, the second color filter layer 820, and the third color filter layer 830, and the quantum-dot layer 630. During the manufacturing process, the first inorganic layer 700 may cover the first color filter layer 810, the second color filter layer 820, and the third color filter layer 830, and have the bank 500 formed on the upper surface thereof. The first inorganic layer 700 may include an inorganic material such as silicon oxide, silicon nitride, and silicon oxynitride and be formed by chemical vapor deposition (CVD). The first inorganic layer 700 may prevent or reduce impurities such as gases generating from the first color filter layer 810, the second color filter layer 820, and/or the third color filter layer 830, penetrating the quantum-dot layer 630 or the emission layer of the organic light-emitting element therebelow, generating defects.

In an embodiment, if desired, a low-refractive layer may be disposed among the first color filter layer 810, the second color filter layer 820, and the third color filter layer 830, and the first inorganic layer 700. The low-refractive layer may include an inorganic material such as silicon oxide, silicon nitride, and silicon oxynitride and be formed by chemical vapor deposition (CVD).

The lower surface of the quantum-dot layer 630 in the direction (the −z direction) to the first substrate 100 and a portion of the surface of the bank 500 in the direction (the −z direction) to the first substrate 100 outside the quantum-dot layer 630 and the spacer 640, may be covered by a second inorganic layer 510. The lower surface of the spacer 640 may be also covered by the second inorganic layer 510. The second inorganic layer 510 may be configured to protect the quantum-dot layer 630. The second inorganic layer 510 may include an inorganic material such as silicon oxide, silicon nitride, and silicon oxynitride. The second inorganic layer 510 may surface-contact the first inorganic layer 700 in the first bank opening 501 and the second bank opening 502 of the bank 500.

The first substrate 100 may be bonded to the second substrate 900 outside the display area with an adhesive member such as sealant. In an embodiment, is desired, a filler 520 may fill a space between a stack body on the first substrate 100 and a stack body on the second substrate 900. In an embodiment, for example, the filler 520 may fill a space between the encapsulation layer 400 and the second inorganic layer 510. The filler 520 may include resin such as acryl or epoxy.

In an embodiment, as shown in FIG. 3, the spacer 640 is disposed on the lower surface of the bank 500 in the direction (the −z direction) to the first substrate 100, specifically, on the lower surface of the bank 500 adjacent to the quantum-dot layer 630. In such an embodiment, as shown in FIG. 3, the spacer 640 is arranged to correspond to a space between the third pixel PX3 in which the quantum-dot layer 630 is disposed and the second pixel PX2 adjacent thereto. However, the embodiment is not limited thereto. In an alternative embodiment, for example, as shown in FIG. 4 which is a schematic cross-sectional view of a portion of a display apparatus according to an embodiment, the spacer 640 is disposed on the lower surface of the bank 500 in the direction (the −z direction) to the first substrate 100 and arranged to correspond to a space between the first pixel PX1 and the second pixel PX2 which are pixels in which the quantum-dot layer 630 is not arranged.

As described above, the spacer 640 and the quantum-dot layer 630 may include the same material as each other and be simultaneously formed during the same manufacturing process. As the resolution of the display apparatus increases, the size of the quantum-dot layer 630 or the spacer 640 reduces when viewed in the direction (the z axis direction) perpendicular to the first substrate 100. Accordingly, in a case where the quantum-dot layer 630 is arranged adjacent to the spacer 640, when a high-resolution display apparatus is manufactured, it may not be easy to accurately form the quantum-dot layer 630 and the spacer 640 at an accurate position and an accurate size in forming the quantum-dot layer 630 and the spacer 640 simultaneously using a same material as each other. Accordingly, a possibility that defects occur may increase. Accordingly, in an embodiment, by positioning the spacer 640 to correspond to a space between the first pixel PX1 and the second pixel PX2 which are pixels in which the quantum-dot layer 630 is not arranged, a defect occurrence rate may be substantially or effectively reduced in manufacturing the high-resolution display apparatus.

However, the embodiment is not limited thereto. In an alternative embodiment, as shown in FIG. 5 which is a schematic cross-sectional view of a portion of the display apparatus according to an embodiment, the spacer 640 and the protrusion 630*b* of the quantum-dot layer 630 may be connected to be integrally formed as a single unitary and indivisible body.

Figure 4:
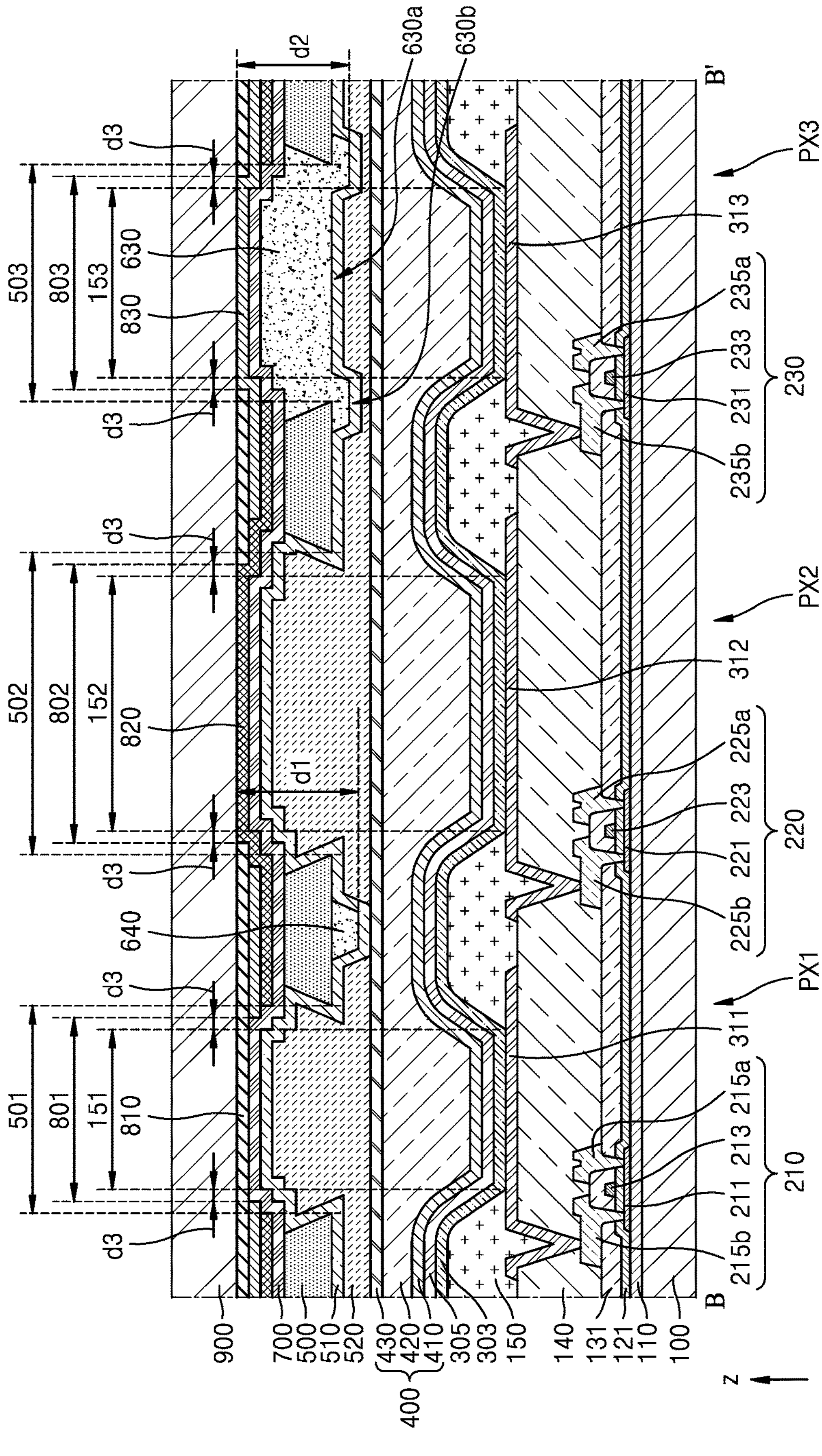
FIG. 4 is a schematic cross-sectional view of a portion of a display apparatus according to an embodiment.
Figure 5:
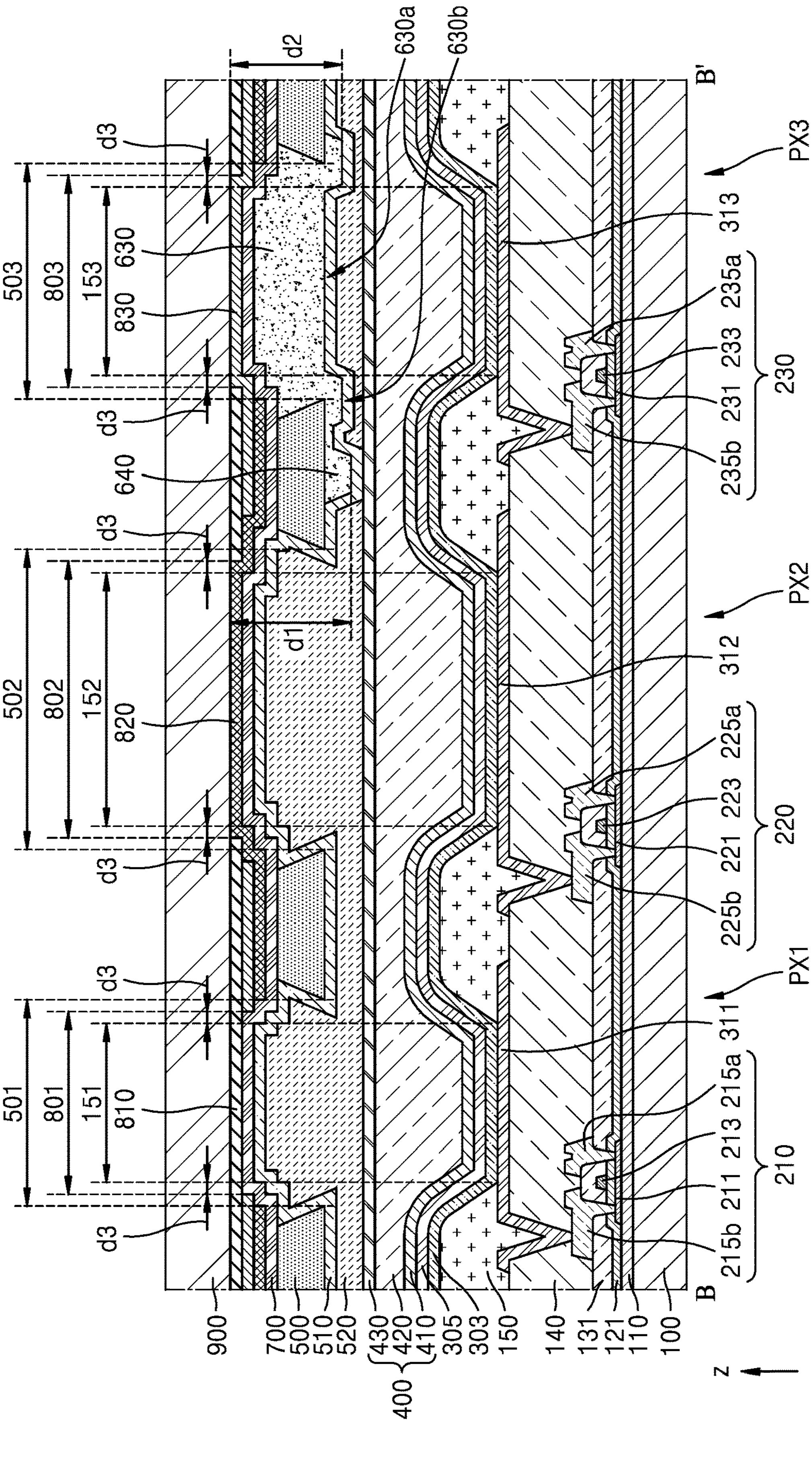
FIG. 5 is a schematic cross-sectional view of a portion of a display apparatus according to an embodiment.

As described above with reference to FIG. 3 and as shown in FIGS. 4 and 5, the quantum-dot layer 630 may include a concave portion 630*a* and a protrusion 630*b*, where the concave portion 630*a* is disposed in the third bank opening 503 of the bank 500, and the protrusion 630*b* is disposed on the surface of the bank 500 in the direction (the −z direction) to the first substrate 100. During the manufacturing process or during use after the manufacturing process, the spacer 640 may not be properly formed, or the spacer 640 may be damaged by external impact or pressure. In the display apparatus according to an embodiment, because the quantum-dot layer 630 includes the protrusion 630*b* protruding in the direction (the −z direction) to the first substrate 100, the protrusion 630*b* of the quantum-dot layer 630 may subsidiarily perform the role of the spacer 640 even in a case where the adjacent spacer 640 is not properly formed or damaged. Accordingly, in such an embodiment, a defect occurrence rate may be reduced during the process of manufacturing the display apparatus, or the life of the display apparatus may be substantially increased.

Figure 6:
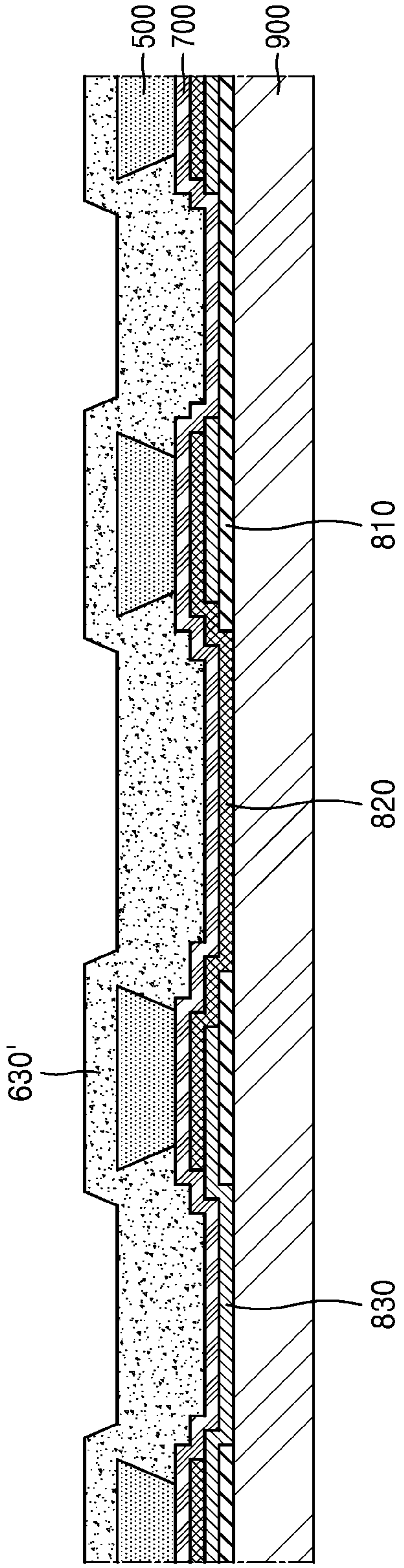
FIGS. 6 and 7 are schematic cross-sectional views showing a process of a method of manufacturing the display apparatus of FIG. 2.
Figure 7:
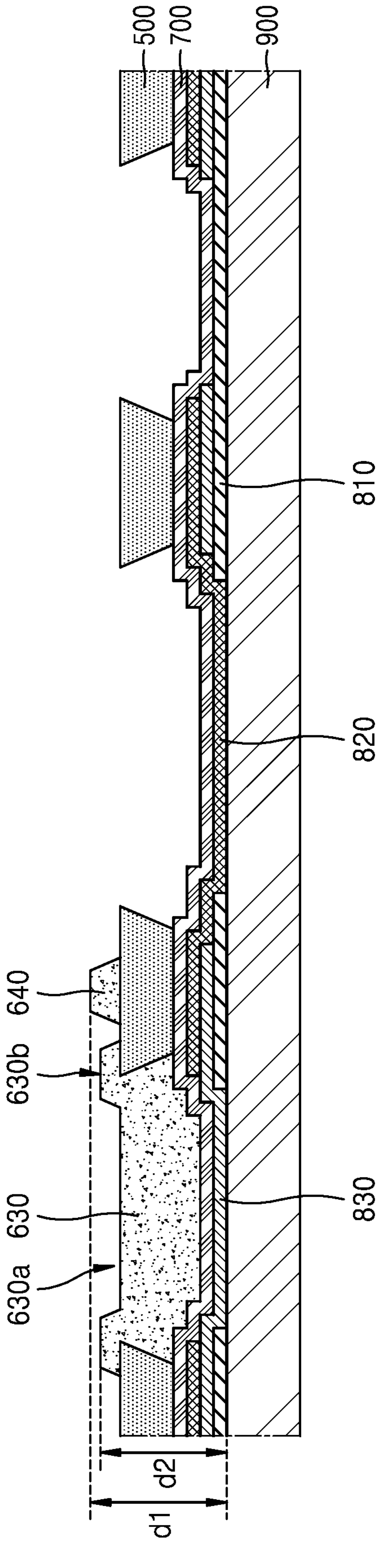

FIGS. 6 and 7 are schematic cross-sectional views showing a process of a method of manufacturing the display apparatus of FIG. 2.

In an embodiment of a method of manufacturing the display apparatus, as shown in FIG. 6, on the surface of the second substrate 900 facing the first substrate 100, the first color filter layer 810, the second color filter layer 820, and the third color filter layer 830 are provided or formed to respectively overlap the first light-emitting element, the second light-emitting element, and the third light-emitting element, and subsequently, the first inorganic layer 700 is provided or formed to cover the first color filter layer 810, the second color filter layer 820, and the third color filter layer 830, and then, the bank 500 is provided or formed on the first inorganic layer 700. In such an embodiment, the bank 500 is provided with the first bank opening, the second bank opening, and the third bank opening, which are formed therethrough. The first bank opening, the second bank opening, and the third bank opening may be formed in portions of the bank 500 that are to respectively overlap the first light-emitting element, the second light-emitting element, and the third light-emitting element.

During a process of forming the second filter opening 802 and the third filter opening 803 of the first color filter layer 810, forming the first filter opening 801 and the additional filter opening of the third color filter layer 830, or forming the second color filter layer 820 that may have an island shape, a patterning method of coating a photoresist, exposing and developing a photoresist layer, then etching a preset portion of the color filter layer, and removing a residual photoresist layer may be performed. Alternatively, by allowing a material for forming the first color filter layer 810, the second color filter layer 820, and the third color filter layer 830 to include the photoresist, without forming a separate photoresist layer, the second filter opening 802 and the third filter opening 803 of the first color filter layer 810 may be formed, the first filter opening 801 and the additional filter opening of the third color filter layer 830 may be formed, or the second color filter layer 820 that may have an island shape may be formed by the exposure and developing processes that use a photomask.

Even when forming the first bank opening, the second bank opening, and the third bank opening of the bank 500, the patterning method of coating a photoresist, exposing and developing a photoresist layer, then etching a preset portion of the bank 500, and removing a residual photoresist layer may be performed. Alternatively, by allowing a material for forming the bank 500 to include the photoresist, without forming a separate photoresist layer, the first to third bank openings may be formed in the bank 500 by the exposure and developing processes that use a photomask.

Then, as shown in FIG. 6, a layer 630' for forming the quantum-dot layer is formed on the bank 500 to fill the first bank opening, the second bank opening, and the third bank opening. The layer 630' for forming the quantum-dot layer may be formed using a slit-coating method. Because the bank 500 includes the first bank opening, the second bank opening, and the third bank opening, the upper surface of the layer 630' for forming the quantum-dot layer is not flat but has concave portions respectively corresponding to the first bank opening, the second bank opening, and the third bank opening. In such an embodiment, the quantum-dot layer 630 and the spacer 640 may be simultaneously formed as shown in FIG. 7 using the patterning method of coating the photoresist, exposing and developing the photoresist layer, then etching a preset portion of the layer 630' for forming the quantum-dot layer, and removing a residual photoresist layer. Alternatively, by allowing the material for forming the quantum-dot layer 630 to include the photoresist, without forming a separate photoresist layer, the quantum-dot layer 630 and the spacer 640 may be simultaneously formed as shown in FIG. 7 by patterning the layer 630' for forming the quantum-dot layer through the exposure and developing processes that use the photomask. In an embodiment, when patterning the layer 630' for forming the quantum-dot layer, the patterning may be performed such that the quantum-dot layer 630 has the concave portion **630*a* and the protrusion 630*b*, where the concave portion 630*a* is disposed in the third bank opening of the bank 500, and the protrusion 630*b* is disposed on the bank 500. That is, by leaving a portion the layer 630' for forming the quantum-dot layer outside the third bank opening, without removing all of the layer 630' for forming the quantum-dot layer, the quantum-dot layer 630 may have the protrusion 630*b* disposed on the bank 500. The concave portion 630*a* and the protrusion 630*b* of the quantum-dot layer 630** may be integrally formed as a single unitary and indivisible body.

The spacer 640 may be apart from the quantum-dot layer 630, and if desired, the spacer 640 and the protrusion **630*b* of the quantum-dot layer 630 may be integrally formed as a single unitary and indivisible body. In an embodiment, as shown in FIG. 7 and as described above, a distance d1 between the surface of the second substrate 900 facing the first substrate 100, and the surface of the spacer 640 facing the first substrate 100 may be greater than a distance d2 between the surface of the second substrate 900 facing the first substrate 100, and the surface of the protrusion 630*b* facing the first substrate 100**.

As described above, in the display apparatus according to an embodiment, the quantum-dot layer 630 is formed not by inkjet printing but by a slit coating method and a patterning method that uses a photoresist. Accordingly, unlike a case of using inkjet printing, a material used when forming the bank 500 does not include a liquid repellent or a hydrophobic material. Accordingly, in such an embodiment, manufacturing costs may be reduced by reducing kinds of materials consumed in manufacturing the display apparatus. In such an embodiment, because all of the processes of patterning the elements formed on the second substrate 900, including the process of forming the quantum-dot layer 630 and the spacer 640 is performed by using the photoresist method in which fine patterning is possible at high precision, the high-resolution display apparatus may be implemented.

In a case where the quantum-dot layer 630 is formed using inkjet printing, the scatterers included in the material for forming the quantum-dot layer sink in an inkjet printing nozzle while the second substrate 900 is prepared, and when inkjet printing is performed after the second substrate 900 and the like are prepared, the number of scatterers per unit volume in the material for forming the quantum-dot layer discharged initially becomes greater than the number of scatterers per unit volume in the material for forming the quantum-dot layer discharged thereafter. Accordingly, even though a signal allowing light of a same brightness to be emitted over the display apparatus entirely is applied to the display apparatus, a defect that light of different brightness is emitted depending on the position may occur. In contrast, in the display apparatus according to an embodiment, because inkjet printing is not used when forming the quantum-dot layer 630, an occurrence of such a defect may be effectively prevented.

As described above, the elements described above are formed on the second substrate 900, and the first light-emitting element, the second light-emitting element, the third light-emitting element, and the like are provided or formed on the first substrate 100. With regard to the process for the first substrate 100 and the process for the second substrate 900, one of the two processes may be performed first and then the other may be performed, or the two processes may be simultaneously performed in parallel. Then, the display apparatus may be manufactured by bonding the first substrate 100 to the second substrate 900. In an embodiment, a filler 520 may be provided to fill a space between a stack body on the first substrate 100 and a stack body on the second substrate 900. In an embodiment, for example, the filler 520 may fill a space between the encapsulation layer 400 and the second inorganic layer 510. The filler 520 may include resin such as acryl or epoxy.

Figure 8:
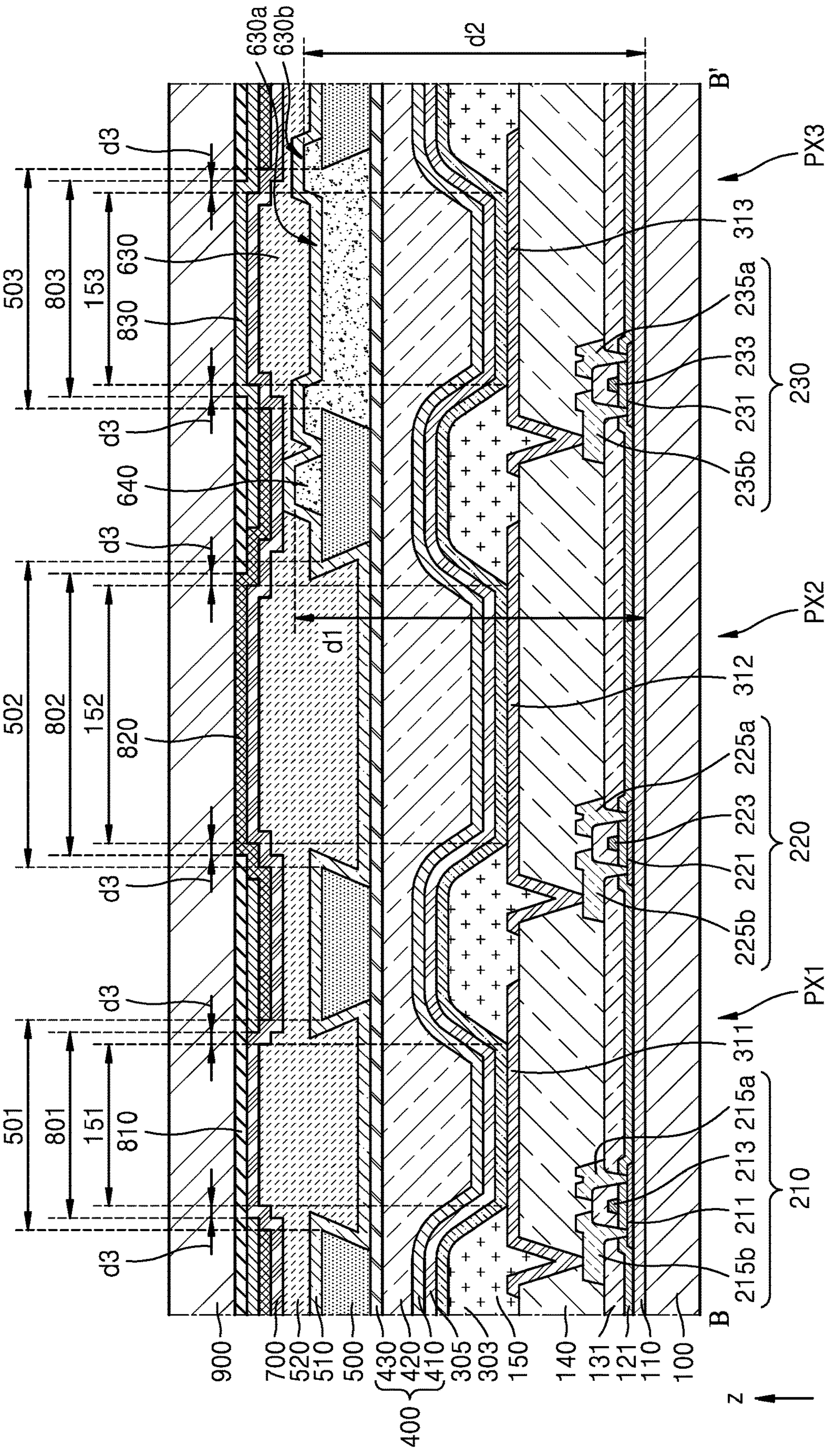
FIG. 8 is a schematic cross-sectional view of a portion of a display apparatus according to an embodiment.

FIG. 8 is a schematic cross-sectional view of a portion of a display apparatus according to an embodiment. The display apparatus shown in FIG. 8 is substantially the same as the display apparatus described above with reference to FIG. 3 except for the position of the bank 500. Hereinafter, any repetitive detailed descriptions of the same or like elements of the display apparatus of FIG. 8 as those described above with reference to FIG. 3 will be omitted, for convenience of description, and only differences will be described.

In the display apparatus according to an embodiment, as shown in FIG. 8, the bank 500 is disposed on not the lower surface of the second substrate 900 facing the first substrate 100 but the encapsulation layer 400 disposed on the first substrate 100. When viewed in the direction (the z axis direction) perpendicular to the first substrate 100, the first bank opening 501, the second bank opening 502, and the third bank opening 503 are defined through the bank 500 to respectively overlap the first light-emitting element, the second light-emitting element, and the third light-emitting element. The quantum-dot layer 630 is disposed in the third bank opening 503 to overlap the third light-emitting element when viewed in the direction (the z axis direction) perpendicular to the first substrate 100. The spacer 640 including the same material as a material of the quantum-dot layer 630 is disposed on the bank 500. The upper surface of the quantum-dot layer 630 in the direction (the +z direction) to the second substrate 900 and a portion of the upper surface of the bank 500 in the direction (the +z direction) to the second substrate 900 outside the quantum-dot layer 630 and the spacer 640, may be covered by the second inorganic layer 510. The second inorganic layer 510 may cover the upper surface of the spacer 640 in the direction (the +z direction) to the second substrate 900.

The second inorganic layer 510 may be configured to protect the quantum-dot layer 630. The second inorganic layer 510 may include an inorganic material such as silicon oxide, silicon nitride, and silicon oxynitride. The second inorganic layer 510 may surface-contact the second inorganic encapsulation layer 430 of the encapsulation layer 400 in the first bank opening 501 and the second bank opening 502 of the bank 500, wherein the second inorganic encapsulation layer 430 is disposed below the bank 500.

In an embodiment, as shown in FIG. 8, the quantum-dot layer 630 may include the concave portion 630*a* and the protrusion 630*b*, where the concave portion 630*a* is disposed in the third bank opening 503 of the bank 500, and the protrusion 630*b* is disposed on the surface of the bank 500 in the direction (the +z direction) to the second substrate 900. In a plan view, the protrusion 630*b* may appear to go around the concave portion 630*a*. This is because the protrusion 630*b* may go around the third bank opening 503 of the bank 500. As shown in FIG. 8, the concave portion 630*a* and the protrusion 630*b* may be integrally formed as a single unitary and indivisible body. The quantum-dot layer 630 may include scatters as described above.

The spacer 640 may be disposed on the surface of the bank 500 in the direction (the +z direction) to the second substrate 900. The spacer 640 may include the same material as a material of the quantum-dot layer 630. Accordingly, the spacer 640 and the quantum-dot layer 630 may include the same material and be simultaneously formed during the manufacturing process. The spacer 640 may maintain a constant interval between a stack body on the first substrate 100 and a stack body on the second substrate 900. In such an embodiment, a distance d1 between the upper surface of the first substrate 100 and the upper surface of the spacer 640 in the direction (the +z direction) to the second substrate 900 may be greater than a distance d2 between the upper surface of the first substrate 100 and the upper surface of the protrusion 630*b* in the direction (the +z direction) to the second substrate 900.

The spacer 640 may be apart from the quantum-dot layer 630 as shown in FIG. 8. Because the spacer 640 is apart from the quantum-dot layer 630 including a same material as a material of the spacer 640 and simultaneously formed with the spacer 640, mechanical strength of the spacer 640 may be increased. In an embodiment, for example, when viewed in the direction (the z axis direction) perpendicular to the first substrate 100, the spacer 640 may have an isolated shape.

In an embodiment, as shown in FIG. 8, the spacer 640 is disposed on the upper surface of the bank 500 in the direction (the +z direction) to the second substrate 900, specifically, on the upper surface of the bank 500 adjacent to the quantum-dot layer 630. In such an embodiment, as shown in FIG. 8, the spacer 640 is arranged to correspond to a space between the third pixel PX3 in which the quantum-dot layer 630 is disposed and the second pixel PX2 adjacent thereto. However, the embodiment is not limited thereto. In an alternative embodiment, for example, as shown in FIG. 9 which is a schematic cross-sectional view of a portion of a display apparatus according to an embodiment, the spacer 640 is disposed on the upper surface of the bank 500 in the direction (the +z direction) to the second substrate 900 and arranged to correspond to a space between the first pixel PX1 and the second pixel PX2 which are pixels in which the quantum-dot layer 630 is not arranged.

As described above, the spacer 640 and the quantum-dot layer 630 may include a same material and be simultaneously formed during the manufacturing process. As the resolution of the display apparatus increases, the size of the quantum-dot layer 630 or the spacer 640 reduces when viewed in the direction (the z axis direction) perpendicular to the first substrate 100. Accordingly, in a case where the quantum-dot layer 630 is arranged adjacent to the spacer 640, when a high-resolution display apparatus is manufactured, it may not be easy to accurately form them at an accurate position and an accurate size in forming them using the same material simultaneously. Accordingly, a possibility that defects occur may increase. In an embodiment, by positioning the spacer 640 to correspond to a space between the first pixel PX1 and the second pixel PX2 which are pixels in which the quantum-dot layer 630 is not arranged, a defect occurrence rate may be remarkably reduced in manufacturing the high-resolution display apparatus.

However, the embodiment is not limited thereto. In another alternative embodiment, as shown in FIG. 10 which is a schematic cross-sectional view of a portion of the display apparatus according to an embodiment, the spacer 640 and the protrusion 630*b* of the quantum-dot layer 630 may be connected to be integrally formed as a single unitary and indivisible body.

Figure 9:
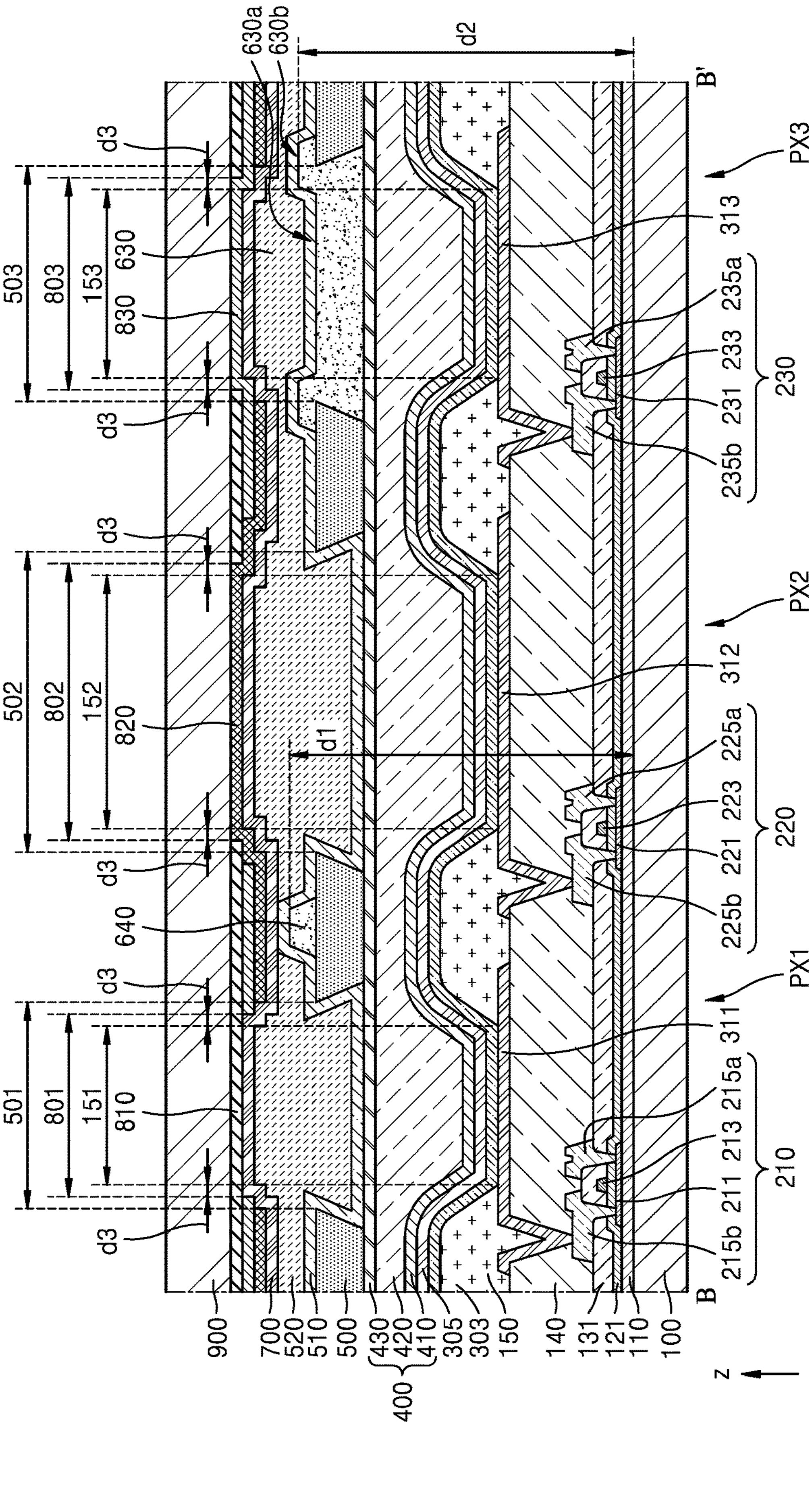
FIG. 9 is a schematic cross-sectional view of a portion of a display apparatus according to an embodiment.
Figure 10:
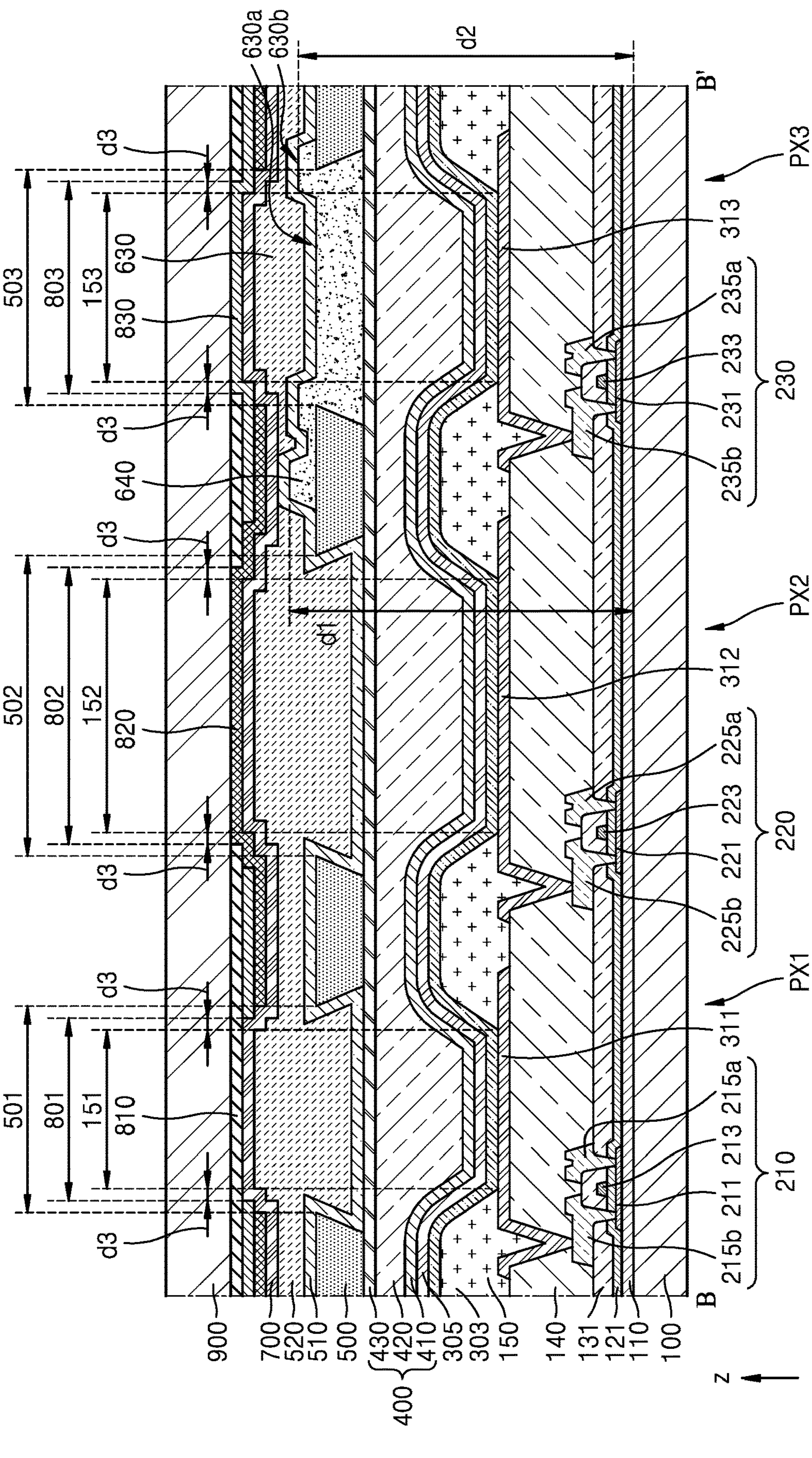
FIG. 10 is a schematic cross-sectional view of a portion of a display apparatus according to an embodiment.

In an embodiment, as described above with reference to FIG. 8 and as shown in FIGS. 9 and 10, the quantum-dot layer 630 may include the concave portion 630*a* and the protrusion 630*b*, where the concave portion 630*a* is disposed in the third bank opening 503 of the bank 500, and the protrusion 630*b* is disposed on the surface of the bank 500 in the direction (the +z direction) to the second substrate 900. During the manufacturing process or during use after the manufacturing process, the spacer 640 may not be properly formed, or the spacer 640 may be damaged by external impact or pressure. In the display apparatus according to an embodiment, because the quantum-dot layer 630 includes the protrusion 630*b* protruding in the direction (the +z direction) to the second substrate 900, in the case where the adjacent spacer 640 is not properly formed or damaged, the protrusion 630*b* of the quantum-dot layer 630 may subsidiarily perform the role of the spacer 640. Accordingly, in such an embodiment, a defect occurrence rate may be substantially reduced during the process of manufacturing the display apparatus, or the life of the display apparatus may be substantially increased.

Figure 11:
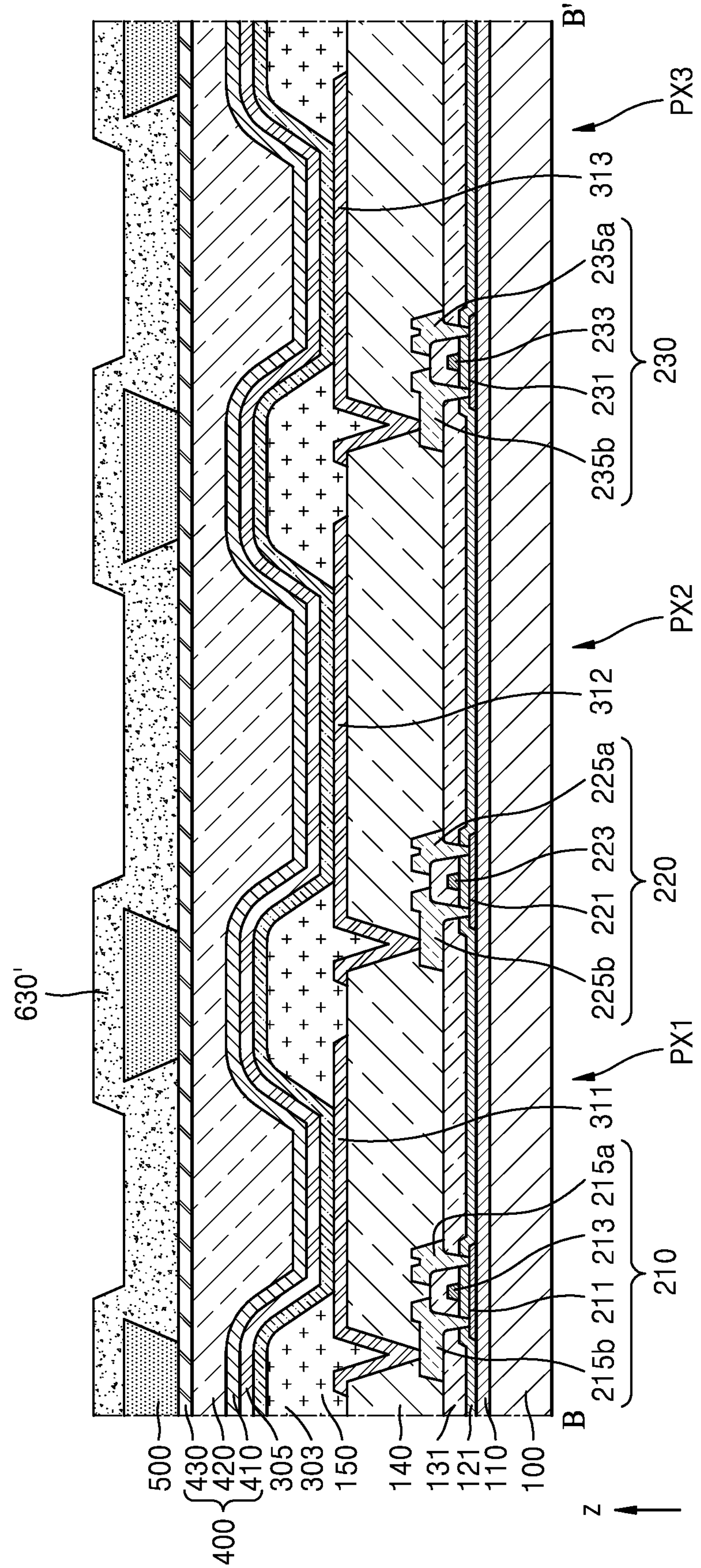
FIGS. 11 and 12 are schematic cross-sectional views showing a process of a method of manufacturing the display apparatus of FIG. 8.
Figure 12:
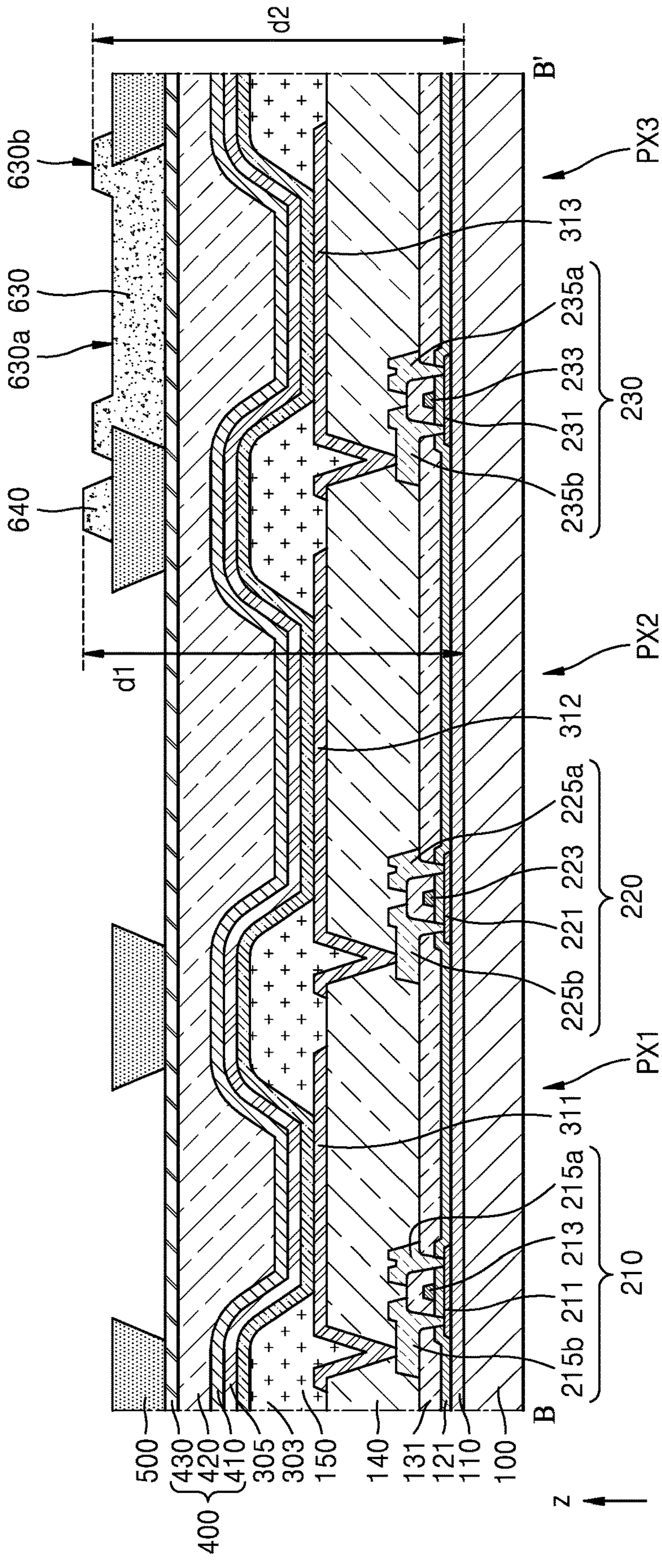

FIGS. 11 and 12 are schematic cross-sectional views showing a process of a method of manufacturing the display apparatus of FIG. 8.

In an embodiment of a method of manufacturing the display apparatus, as shown in FIG. 11, after the encapsulation layer 400 covering the first light-emitting element, the second light-emitting element, and the third light-emitting element is formed, the bank 500 including the first bank opening, the second bank opening, and the third bank opening is formed. The first bank opening, the second bank opening, and the third bank opening may be formed in portions of the bank 500 that are to respectively overlap the first light-emitting element, the second light-emitting element, and the third light-emitting element.

When forming the first bank opening, the second bank opening, and the third bank opening of the bank 500, the patterning method of coating a photoresist, exposing and developing a photoresist layer, then etching a preset portion of the bank 500, and removing a residual photoresist layer may be performed. Alternatively, by allowing a material for forming the bank 500 to include the photoresist, without forming a separate photoresist layer, the first to third bank openings may be formed in the bank 500 by the exposure and developing processes that use a photomask.

Then, as shown in FIG. 11, a layer 630' for forming the quantum-dot layer is provided or formed on the bank 500 to fill the first bank opening, the second bank opening, and the third bank opening. The layer 630' for forming the quantum-dot layer may be formed using a slit-coating method. Because the bank 500 includes the first bank opening, the second bank opening, and the third bank opening, the upper surface of the layer 630' for forming the quantum-dot layer is not flat but has concave portions respectively corresponding to the first bank opening, the second bank opening, and the third bank opening. In such an embodiment, the quantum-dot layer 630 and the spacer 640 may be simultaneously formed as shown in FIG. 12 using the patterning method of coating the photoresist, exposing and developing the photoresist layer, then etching a preset portion of the layer 630' for forming the quantum-dot layer, and removing a residual photoresist layer. Alternatively, by allowing the material for forming the quantum-dot layer 630 to include the photoresist, without forming a separate photoresist layer, the quantum-dot layer 630 and the spacer 640 may be simultaneously formed as shown in FIG. 12 by patterning the layer 630' for forming the quantum-dot layer through the exposure and developing processes that use the photomask. In an embodiment, when patterning the layer 630' for forming the quantum-dot layer, the patterning may be performed such that the quantum-dot layer 630 has the concave portion **630*a* and the protrusion 630*b*, where the concave portion 630*a* is disposed in the third bank opening of the bank 500, and the protrusion 630*b* is disposed on the bank 500. That is, by leaving a portion of the layer 630' for forming the quantum-dot layer outside the third bank opening, without removing all of the layer 630' for forming the quantum-dot layer, the quantum-dot layer 630 may have the protrusion 630*b* disposed on the bank 500. The concave portion 630*a* and the protrusion 630*b* of the quantum-dot layer 630** may be integrally formed as a single unitary and indivisible body.

The spacer 640 may be apart from the quantum-dot layer 630, and alternatively, the spacer 640 and the protrusion **630*b* of the quantum-dot layer 630 may be integrally formed as a single unitary and indivisible body. As described above, a distance d1 between the surface of the first substrate 100 facing the second substrate 900, and the surface of the spacer 640 facing the second substrate 900 may be greater than a distance d2 between the surface of the first substrate 100 facing the second substrate 900, and the surface of the protrusion 630*b* facing the second substrate 900**.

As described above, in the display apparatus according to an embodiment, the quantum-dot layer 630 is formed not by inkjet printing but by a slit coating method and a patterning method that uses a photoresist. Accordingly, unlike a case of using inkjet printing, a material used when forming the bank 500 does not include a liquid repellent or a hydrophobic material. Accordingly, in such an embodiment, manufacturing costs may be reduced by reducing kinds of materials consumed in manufacturing the display apparatus. Because all of the process of forming the quantum-dot layer 630 and the spacer 640 may be performed by using the photoresist method in which fine patterning is possible at high precision, the high-resolution display apparatus may be implemented.

The quantum-dot layer 630 and the spacer 640 are formed, and then the second inorganic layer 510 may be formed to cover them and the bank 500.

In an embodiment, as described above, the first light-emitting element, the second light-emitting element, the third light-emitting element, the encapsulation layer 400, the bank 500, the quantum-dot layer 630, the spacer 640, the second inorganic layer 510, and the like are provided or formed on the first substrate 100. The first color filter layer 810, the second color filter layer 820, the third color filter layer 830, the first inorganic layer 700, and the like are formed on the second substrate 900. With regard to the process for the first substrate 100 and the process for the second substrate 900, one of the two processes may be performed first and then the other may be performed, or the two processes may be simultaneously performed in parallel. Then, the display apparatus may be manufactured by bonding the first substrate 100 to the second substrate 900. In an embodiment, a filler 520 may fill a space between a stack body on the first substrate 100 and a stack body on the second substrate 900. In an embodiment, for example, the filler 520 may fill a space between the first inorganic layer 700 and the second inorganic layer 510. The filler 520 may include resin such as acryl or epoxy.

According to an embodiment, the display apparatus manufactured by a simple process and capable of displaying high-resolution images, and a method of manufacturing the display apparatus may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:

a first substrate;

first to third light-emitting elements disposed over the first substrate and each including a first-color emission layer and a second-color emission layer;

a second substrate disposed over the first substrate with the first to third light-emitting elements therebetween;

a bank disposed on a lower surface of the second substrate facing the first substrate, wherein first to third bank openings are defined through the bank to respectively overlap the first to third light-emitting elements when viewed in a direction perpendicular to the first substrate;

a first color filter layer disposed between the bank and the second substrate and overlapping the first light-emitting element when viewed in the direction perpendicular to the first substrate;

a second color filter layer disposed between the bank and the second substrate and overlapping the second light-emitting element when viewed in the direction perpendicular to the first substrate;

a third color filter layer disposed between the bank and the second substrate and overlapping the third light-emitting element when viewed in the direction perpendicular to the first substrate;

a quantum-dot layer disposed in the third bank opening to overlap the third light-emitting element when viewed in the direction perpendicular to the first substrate, wherein the quantum-dot layer includes a concave portion disposed in the third bank opening and a protrusion disposed on a surface of the bank facing the first substrate; and a spacer disposed on a lower surface of the bank facing the first substrate and including a same material as a material of the quantum-dot layer, wherein a distance between the lower surface of the second substrate and a lower surface of the spacer is greater than a distance between the lower surface of the second substrate and a lower surface of the protrusion.

2. The display apparatus of claim 1, wherein the protrusion and the concave portion are integrally formed as a single unitary and indivisible body.

3. The display apparatus of claim 1, wherein the spacer and the protrusion are integrally formed as a single unitary and indivisible body.

4. The display apparatus of claim 1, wherein the spacer is apart from the quantum-dot layer when viewed in the direction perpendicular to the first substrate.

5. The display apparatus of claim 1, further comprising:

a first inorganic layer disposed between the first to third color filter layers and the bank; and a second inorganic layer covering a portion of the lower surface of the bank facing the first substrate and a lower surface of the quantum dot layer facing the first substrate, wherein the portion of the lower surface of the bank is outside the quantum dot layer and the spacer.

6. The display apparatus of claim 5, wherein the second inorganic layer contacts the first inorganic layer in the first bank opening and in the second bank opening.

7. The display apparatus of claim 1, wherein each of the first color filter layer, the second color filter layer, and the quantum-dot layer includes scatterers.

8. The display apparatus of claim 1, wherein the bank does not include a liquid repellent or hydrophobic material.

9. The display apparatus of claim 1, wherein the first color filter layer allows light from the first-color emission layer to pass therethrough, the second color filter layer allows light from the second-color emission layer to pass therethrough, and the quantum-dot layer converts a wavelength of light from the first-color emission layer or light from the second-color emission layer into a wavelength of light which the third color filter layer allows to pass therethrough.

10. The display apparatus of claim 1, wherein the third color filter layer allows red light to pass therethrough.

11. A display apparatus comprising:

a first substrate;

first to third light-emitting elements disposed over the first substrate and each including a first-color emission layer and a second-color emission layer;

an encapsulation layer covering the first to third light-emitting elements;

a bank disposed on the encapsulation layer, wherein first to third bank openings are defined through the bank to respectively overlap the first to third light-emitting elements when viewed in a direction perpendicular to the first substrate;

a quantum-dot layer disposed in the third bank opening to overlap the third light-emitting element when viewed in the direction perpendicular to the first substrate, wherein the quantum-dot layer includes a concave portion disposed in the third bank opening and a protrusion disposed on a surface of the bank facing the first substrate;

a spacer disposed on the bank and including a same material as a material of the quantum-dot layer;

a second substrate disposed over the first substrate with the bank and the spacer therebetween;

a first color filter layer disposed on a lower surface of the second substrate facing the first substrate and overlapping the first light-emitting element when viewed in the direction perpendicular to the first substrate;

a second color filter layer disposed on the lower surface of the second substrate facing the first substrate and overlapping the second light-emitting element when viewed in the direction perpendicular to the first substrate; and a third color filter layer disposed on the lower surface of the second substrate facing the first substrate and overlapping the third light-emitting element when viewed in the direction perpendicular to the first substrate, wherein a distance between an upper surface of the first substrate and an upper surface of the spacer is greater than a distance between the upper surface of the first substrate and an upper surface of the protrusion.

12. The display apparatus of claim 11, wherein the protrusion and the concave portion are integrally formed as a single unitary and indivisible body.

13. The display apparatus of claim 11, wherein the spacer and the protrusion are integrally formed as a single unitary and indivisible body.

14. The display apparatus of claim 11, wherein the spacer is apart from the quantum-dot layer when viewed in the direction perpendicular to the first substrate.

15. The display apparatus of claim 11, further comprising:

a first inorganic layer covering surfaces of the first to third color filter layers facing the first substrate; and a second inorganic layer covering a portion of an upper surface of the bank facing the second substrate and an upper surface of the quantum-dot layer facing the second substrate, wherein the portion of the upper surface of the bank is outside the quantum dot layer and the spacer.

16. The display apparatus of claim 11, wherein each of the first color filter layer, the second color filter layer, and the quantum-dot layer includes scatterers.

17. The display apparatus of claim 11, wherein the bank does not include a liquid repellent or hydrophobic material.

18. The display apparatus of claim 11, wherein the first color filter layer is allows light from the first-color emission layer to pass therethrough, the second color filter layer allows light from the second-color emission layer to pass therethrough, and the quantum-dot layer converts a wavelength of light from the first-color emission layer or light from the second-color emission layer into a wavelength of light which the third color filter layer allows to pass therethrough.

19. The display apparatus of claim 11, wherein the third color filter layer allows red light to pass therethrough.

20. A method of manufacturing a display apparatus, the method comprising:

providing first to third light-emitting elements over a first substrate, wherein each of the first to third light-emitting elements includes a first-color emission layer and a second-color emission layer;

providing a bank, through which first to third bank openings are formed to respectively overlap the first to third light-emitting elements; and simultaneously forming a quantum-dot layer and a spacer, wherein the quantum-dot layer is provided in the third bank opening to include a concave portion provided in the third bank opening and a protrusion provided on a surface of the bank facing the first substrate and the spacer is provided on the bank, wherein a distance between a surface of the second substrate facing the first substrate and a surface of the spacer facing the first substrate is greater than a distance between the surface of the second substrate facing the first substrate and a surface of the protrusion facing the first substrate.

21. The method of claim 20, further comprising:

providing a first color filter layer on a second substrate to overlap the first light-emitting element;

providing a second color filter layer on the second substrate to overlap the second light-emitting element; and providing a third color filter layer on the second substrate to overlap the third light-emitting element, wherein the providing the bank includes forming the bank on the first to third color filter layers.

22. The method of claim 21, wherein the protrusion and the concave portion are integrally formed as a single unitary and indivisible body.

23. The method of claim 21, wherein the spacer and the protrusion are integrally formed as a single unitary and indivisible body.

24. The method of claim 21, wherein the spacer is apart from the quantum-dot layer when viewed in a direction perpendicular to the first substrate.

25. The method of claim 20, further comprising:

providing an encapsulation layer to cover the first to third light-emitting elements, wherein the providing the bank includes forming the bank on the encapsulation layer.

26. The method of claim 25, wherein the protrusion and the concave portion are integrally formed as a single unitary and indivisible body.

27. The method of claim 25, wherein the spacer and the protrusion are integrally formed as a single unitary and indivisible body.

28. The method of claim 25, wherein the spacer is apart from the quantum-dot layer when viewed in a direction perpendicular to the first substrate.

* * * * *